(12) United States Patent
Keeth et al.

(10) Patent No.: US 8,299,514 B2
(45) Date of Patent: Oct. 30, 2012

(54) HIGH DENSITY INTEGRATED CIRCUITRY FOR SEMICONDUCTOR MEMORY HAVING MEMORY CELLS WITH A MINIMUM CAPABLE PHOTOLITHOGRAPHIC FEATURE DIMENSION

(75) Inventors: Brent Keeth, Boise, ID (US); Pierre Fazan, Boise, ID (US)

(73) Assignee: Round Rock Research, LLC, Mt. Kisco, NY (US)

( * ) Notice: Subject to any disclaimer, the term of this patent is extended or adjusted under 35 U.S.C. 154(b) by 0 days.

(21) Appl. No.: 13/285,182

(22) Filed: Oct. 31, 2011

(65) Prior Publication Data

US 2012/0044752 A1    Feb. 23, 2012

Related U.S. Application Data

(60) Division of application No. 12/713,673, filed on Feb. 26, 2010, now Pat. No. 8,049,260, which is a continuation of application No. 08/530,661, filed on Sep. 20, 1995, now Pat. No. 7,705,383.

(51) Int. Cl.
*H01L 29/94* (2006.01)
(52) U.S. Cl. .................... 257/300; 257/E27.084
(58) Field of Classification Search .................. 257/300, 257/309
See application file for complete search history.

(56) References Cited

U.S. PATENT DOCUMENTS

| | | |
|---|---|---|
| 3,725,842 A | 4/1973 | Feldberg |
| 4,462,846 A | 7/1984 | Varshney |
| 4,956,307 A | 9/1990 | Pollack et al. |
| 4,958,318 A | 9/1990 | Harari |
| 5,006,909 A | 4/1991 | Kosa |
| 5,013,680 A | 5/1991 | Lowrey et al. |
| 5,055,898 A | 10/1991 | Beilstein, Jr. et al. |
| 5,107,459 A | 4/1992 | Chu et al. |
| 5,128,737 A | 7/1992 | van der Have |
| 5,245,206 A | 9/1993 | Chu et al. |
| 5,287,000 A | 2/1994 | Takahashi et al. |

(Continued)

FOREIGN PATENT DOCUMENTS

EP      0461498 A2    12/1991

(Continued)

OTHER PUBLICATIONS

Anthony Denboer, "Inside Today's Leading Edge Microprocessors," Semiconductor International, Feb. 1994.

(Continued)

*Primary Examiner* — Marcos D. Pizarro
*Assistant Examiner* — Eva Y. Montalvo
(74) *Attorney, Agent, or Firm* — Lerner, David, Littenberg, Krumholz & Mentlik, LLP

(57) ABSTRACT

Processes are disclosed which facilitate improved high-density memory circuitry, most preferably dynamic random access memory (DRAM) circuitry. A semiconductor memory device includes i) a total of no more than 68,000,000 functional and operably addressable memory cells arranged in multiple memory arrays formed on a semiconductor die; and ii) circuitry formed on the semiconductor die permitting data to be written to and read from one or more of the memory cells. At least one of the memory arrays contains at least 100-square microns of continuous die surface area having at least 128 of the functional and operably addressable memory cells. More preferably, at least 100 square microns of continuous die surface area have at least 170 of the functional and operably addressable memory cells.

2 Claims, 23 Drawing Sheets

U.S. PATENT DOCUMENTS

| | | | |
|---|---|---|---|
| 5,290,729 A | 3/1994 | Hayashide et al. | |
| 5,326,715 A | 7/1994 | Jang et al. | |
| 5,338,700 A | 8/1994 | Dennison et al. | |
| 5,338,897 A | 8/1994 | Tsay et al. | |
| 5,360,753 A | 11/1994 | Park et al. | |
| 5,378,908 A | 1/1995 | Chin et al. | |
| 5,396,450 A | 3/1995 | Takashima et al. | |
| 5,407,534 A | 4/1995 | Thakur | |
| 5,426,603 A | 6/1995 | Nakamura et al. | |
| 5,519,238 A | 5/1996 | Lu | |
| 5,555,212 A | 9/1996 | Toshiaki et al. | |
| 5,555,519 A | 9/1996 | Takashima et al. | |
| 5,564,577 A | 10/1996 | Knaggs | |
| 5,610,418 A | 3/1997 | Eimori | |
| 5,629,230 A | 5/1997 | Fazan et al. | |
| 5,654,577 A | 8/1997 | Nakamura et al. | |
| 5,658,381 A | 8/1997 | Thakur et al. | |
| 5,677,867 A * | 10/1997 | Hazani | 365/185.01 |
| 5,767,521 A | 6/1998 | Takeno et al. | |
| 5,770,500 A | 6/1998 | Batra et al. | |
| 5,838,038 A | 11/1998 | Takashima et al. | |
| 5,864,181 A | 1/1999 | Keeth | |
| 5,866,453 A | 2/1999 | Prall et al. | |
| 6,043,562 A | 3/2000 | Keeth | |
| 6,084,307 A | 7/2000 | Keeth | |
| 6,222,275 B1 | 4/2001 | Keeth | |
| 6,243,311 B1 | 6/2001 | Keeth | |
| 6,288,421 B1 | 9/2001 | Keeth et al. | |
| 6,392,303 B2 | 5/2002 | Keeth | |
| 6,429,529 B1 | 8/2002 | Keeth | |

FOREIGN PATENT DOCUMENTS

| | | |
|---|---|---|
| EP | 0488625 A2 | 6/1992 |
| JP | 2058377 A | 2/1990 |
| JP | 3116865 A | 5/1991 |
| JP | 3116885 A | 5/1991 |
| JP | 05226610 A | 9/1993 |
| JP | 06177347 A | 6/1994 |
| JP | 6216343 A | 8/1994 |
| JP | 7093990 A | 4/1995 |

OTHER PUBLICATIONS

Eimori et al. "A Newly Designed Planar Stacked Capacitor Cell with High Dielectric Constant Film for 256 Mbit DRAM" IEDM 1993, pp. 26.3.1-.4.*.

European Search Report completed Feb. 26, 2003 for European Application No. EP 03,001,319.

Hamamoto, T., et al., "NAND-Structured Trench Capacitor Cell Technologies for 256 MB DRAM and Beyond," IEICE Transactions on Electronics, Institute of Electronics Information and Comm. Eng. Tokyo, JP, vol. E78-C, NR. 7, pp. 789-796 (Jul. 1995).

JPO Notice of Reasons for Rejection, dated Jul. 6, 2004.

Kitsukawa et al., "256-MB DRAM Circuit Technologies for File Applications", IEEE Journal of Solid-State Circuits, vol. 28, No. 11, Nov. 1993, pp. 1105-1113.

Sugibayashi et al., "A 30-ns 256-Mb DRAM With a Multidivided Array Structure", IEEE Journal of Solid-State Circuits, vol. 28, No. 11, Nov. 1993, pp. 1092-1098.

Sunouchi et al., A Srrounding Gate (SGT) Cell for 64/256Mbit DRAMs, IEDM 89-23, 1989.

Tadahiko, Sugibayash et al., "A 30-ns 256-MbDRAM With a Multidivided Array Structure", IEEE Journal of Solid-State Circuits, vol. 28, No. 11, Nov. 1993, pp. 1092-1098.

Watanabe et al., A Novel Circuit Technology with Surounding Gate Transistors, Sep. 9, 1995,IEEE J. Solid State Cir. pp. 960-970.

* cited by examiner

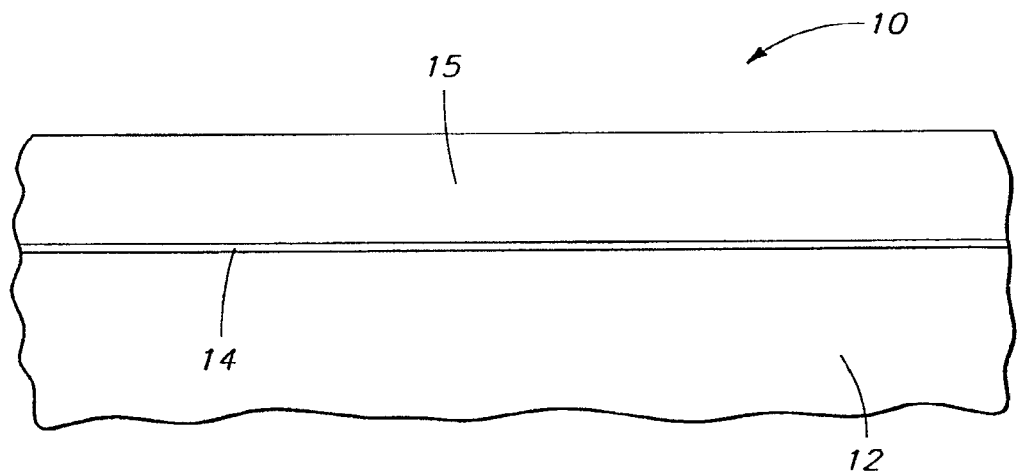
_Fig. 1_
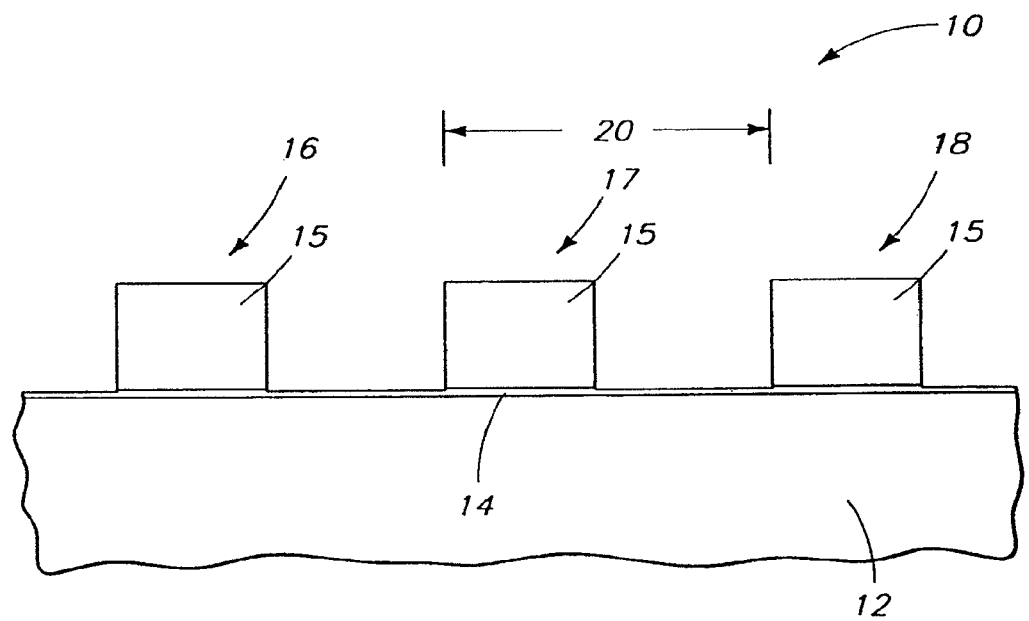
_Fig. 2_

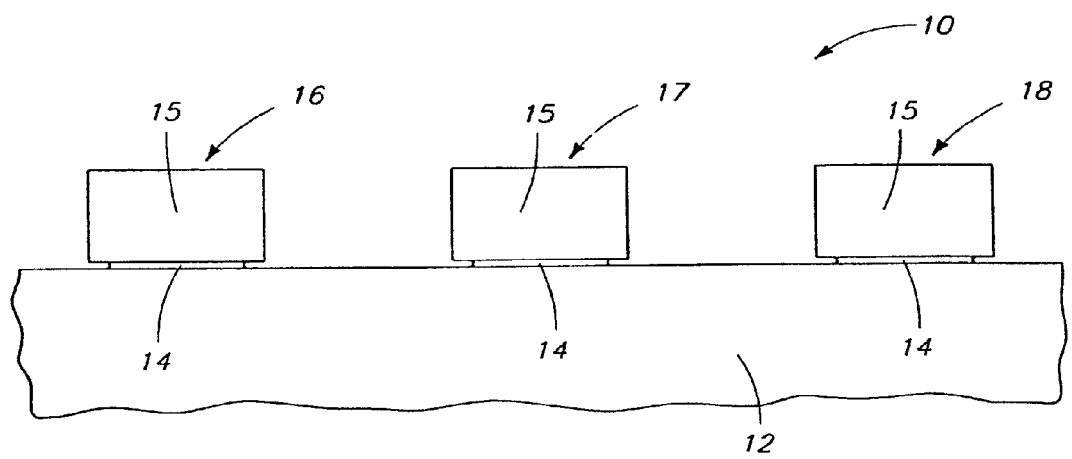
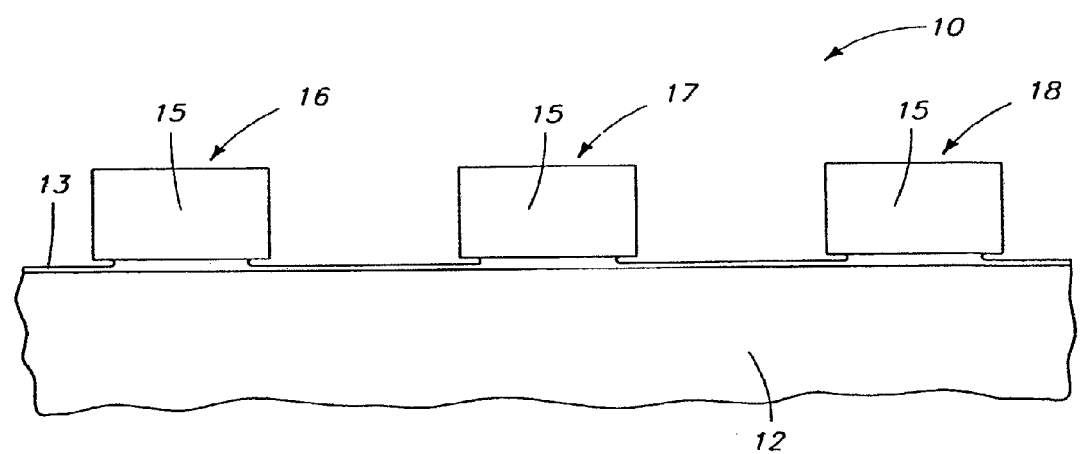

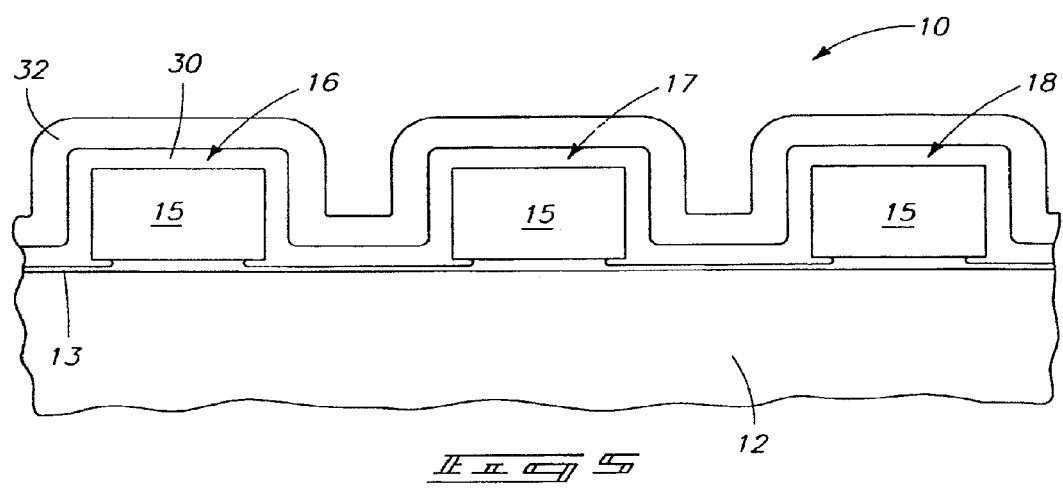
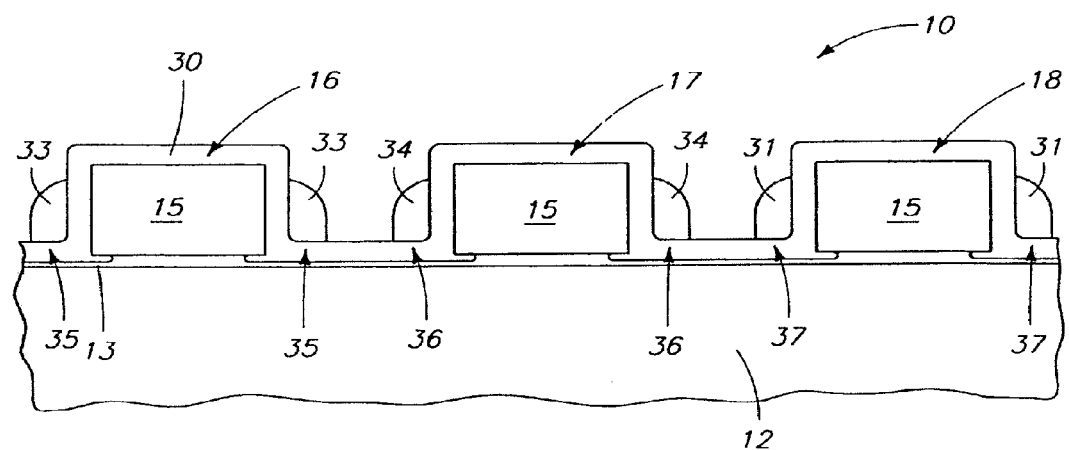

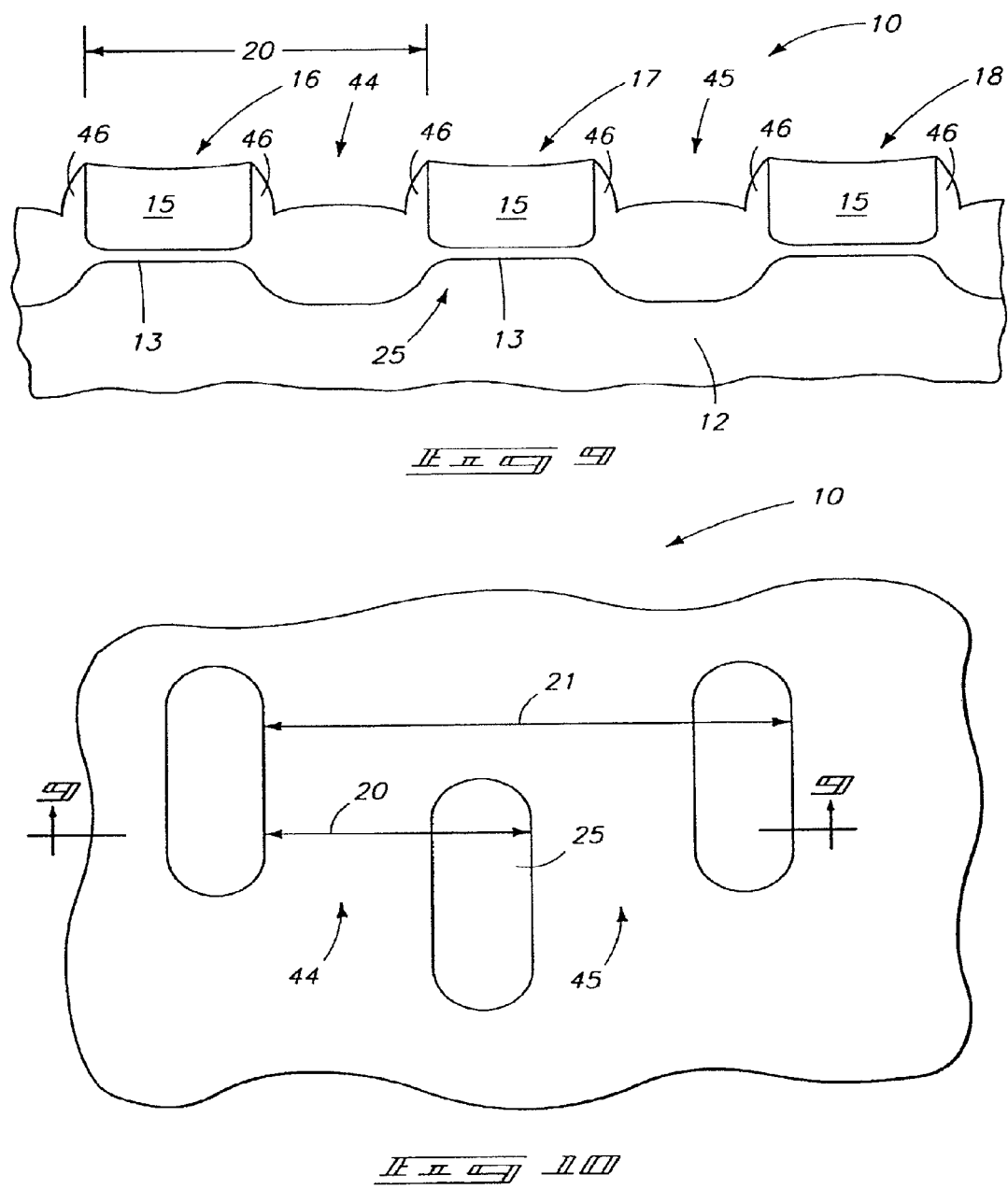

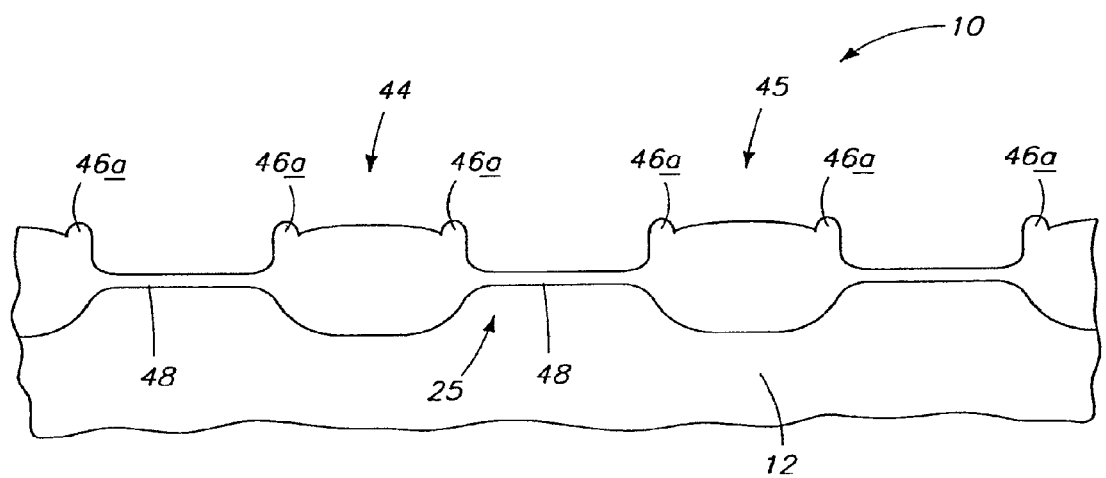
_Fig. 11_
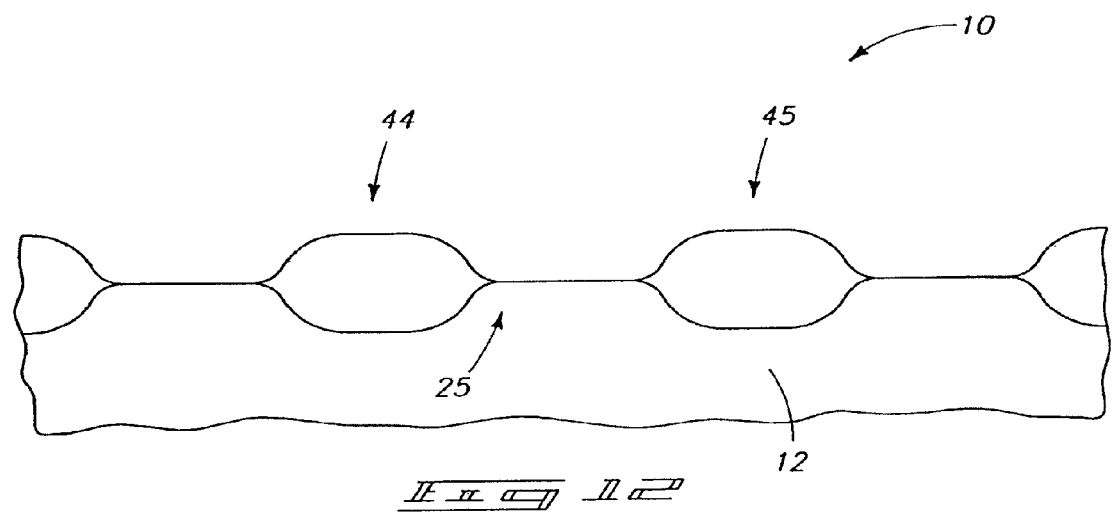
_Fig. 12_

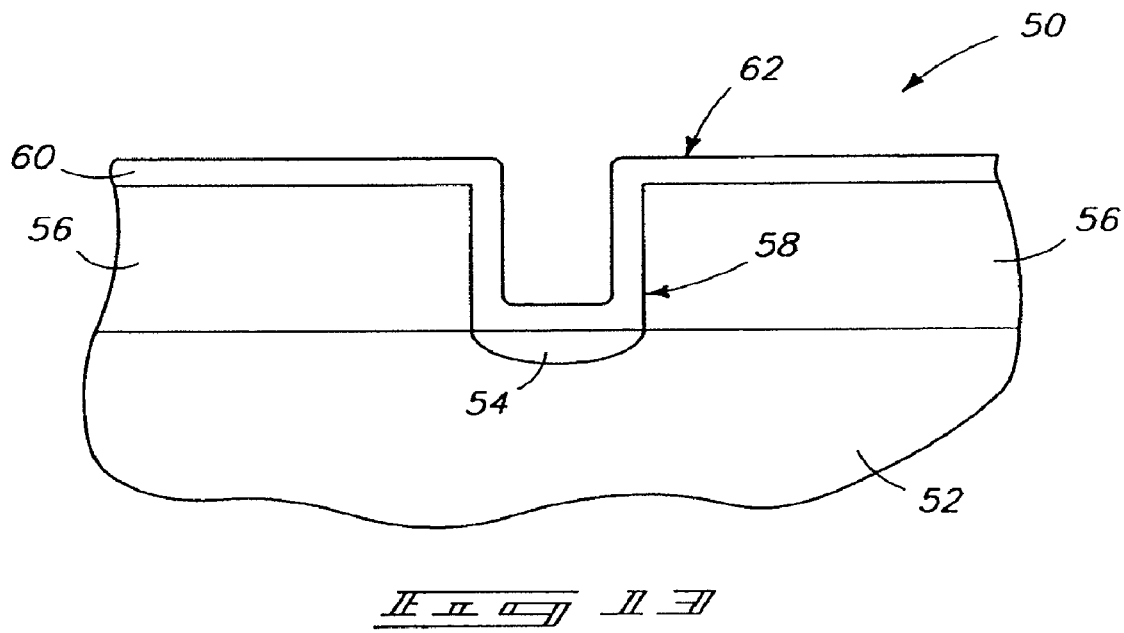
F I G. 13
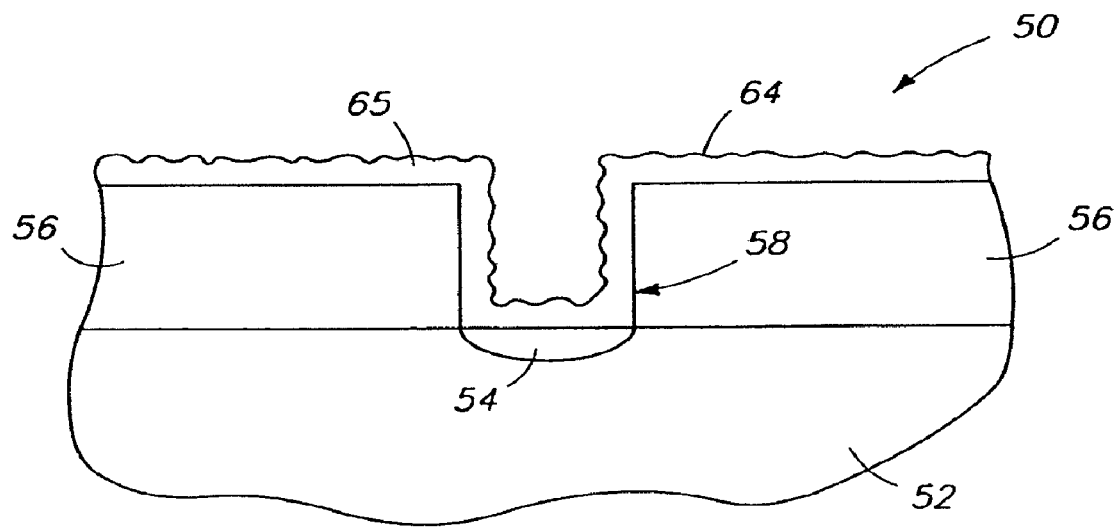
F I G. 14

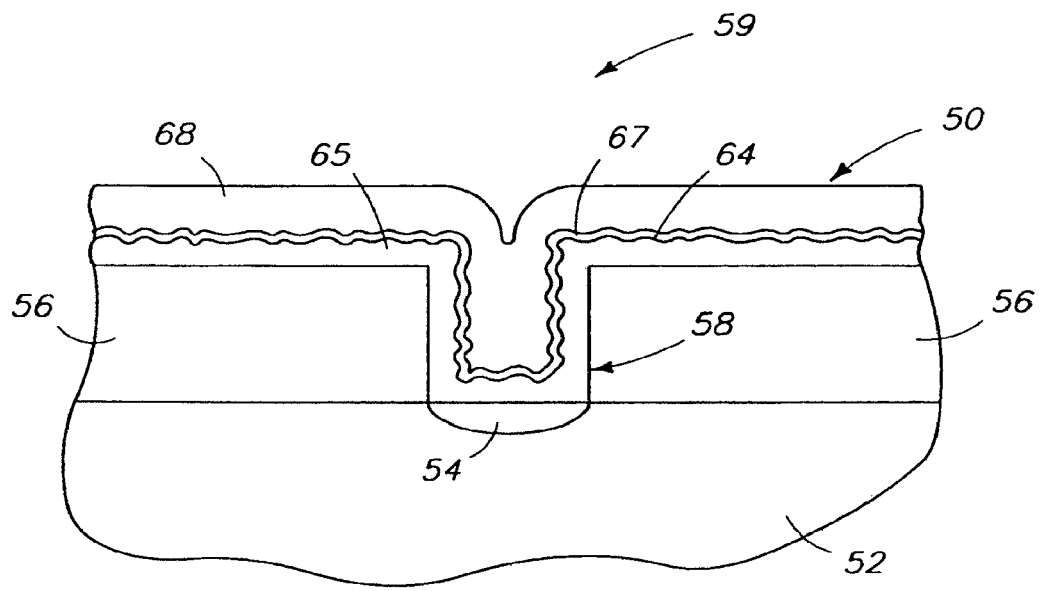
𝐹𝐼𝐺 15
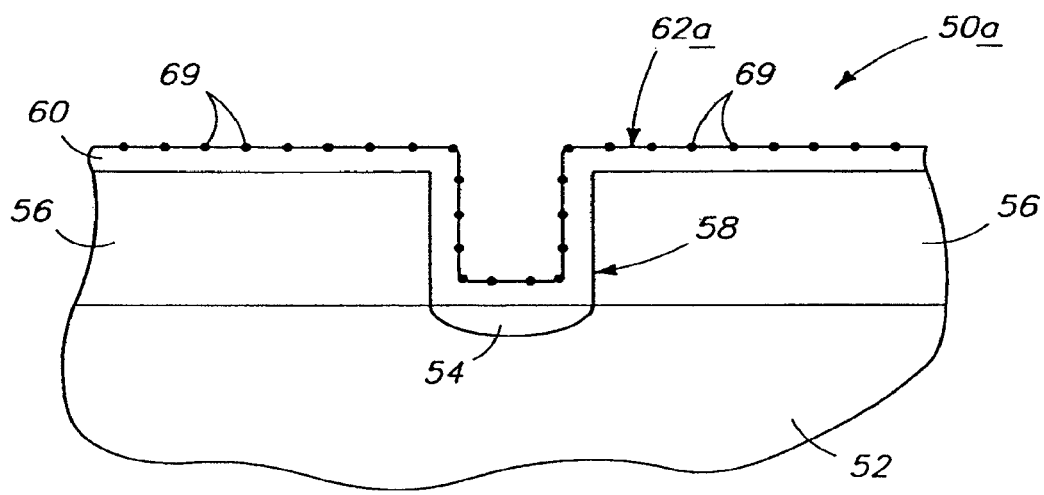
𝐹𝐼𝐺 16

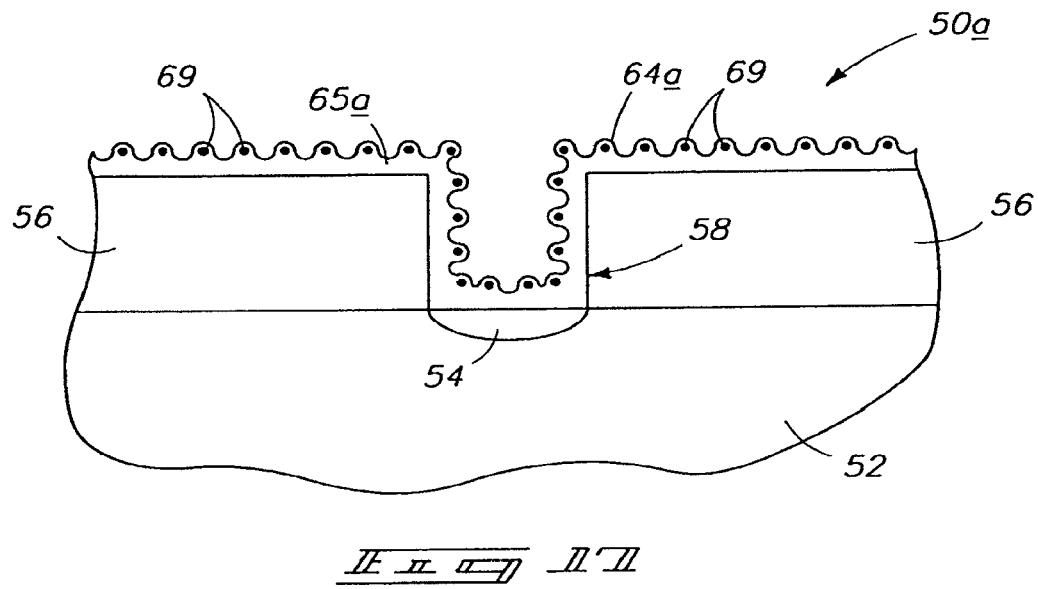
_Fig. 17_
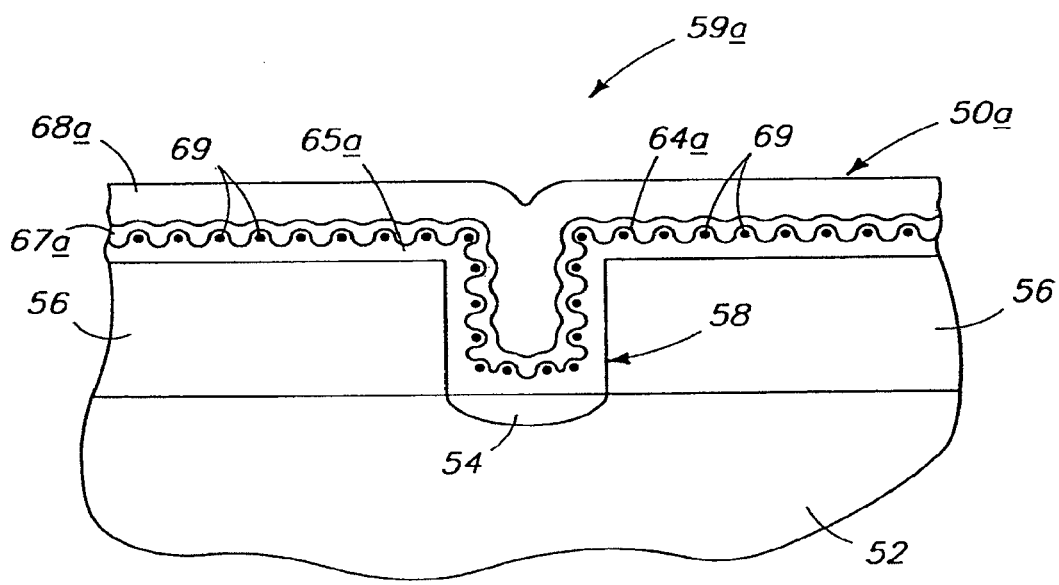
_Fig. 18_

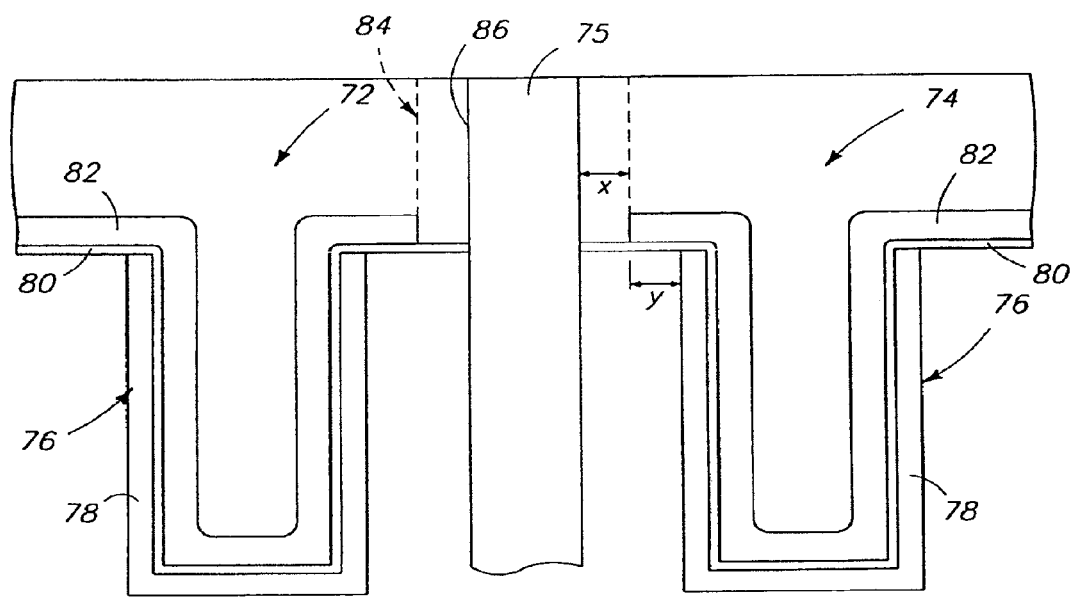
_Fig 19_
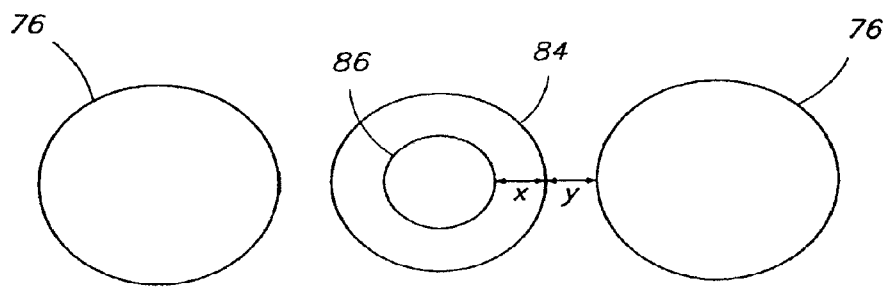
_Fig 20_

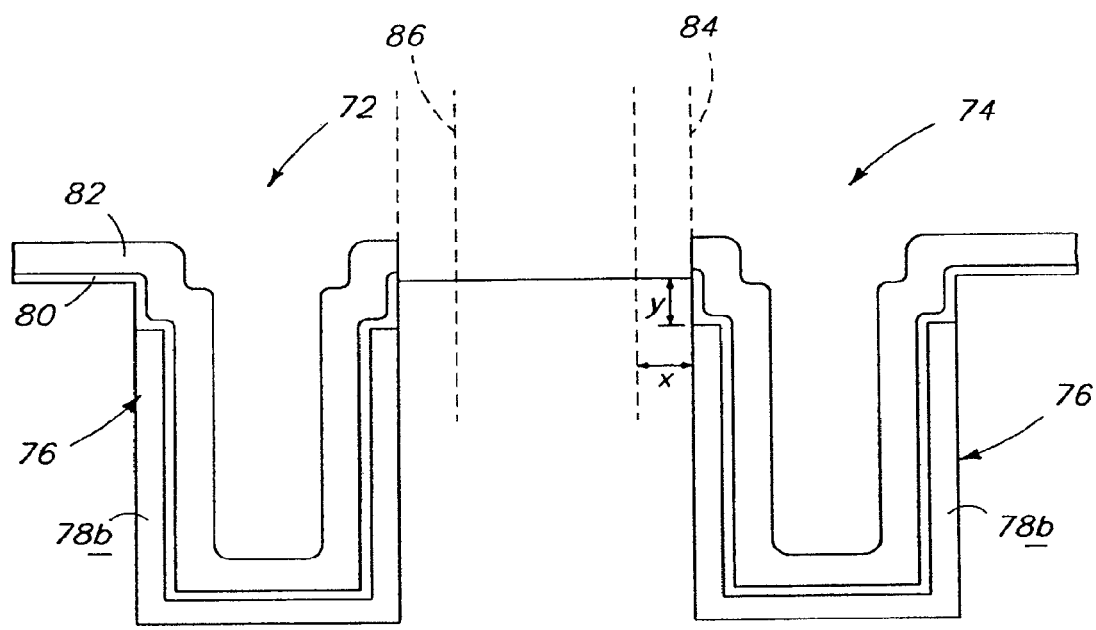
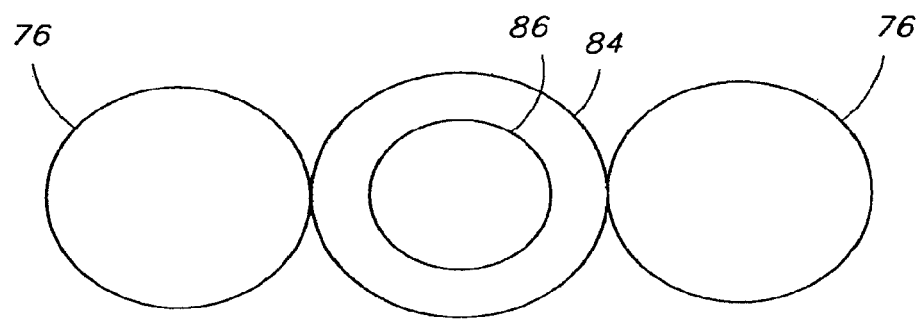

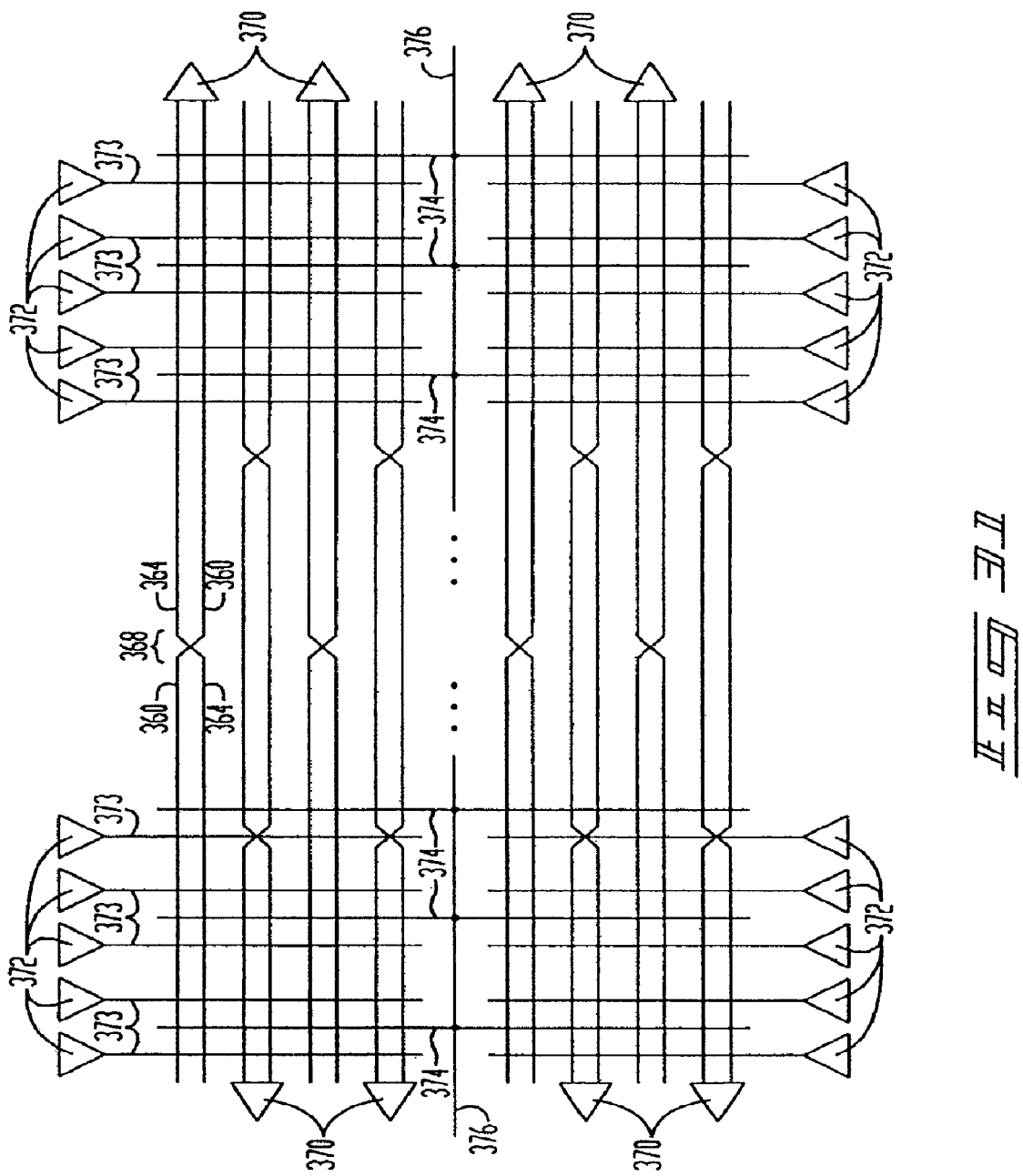

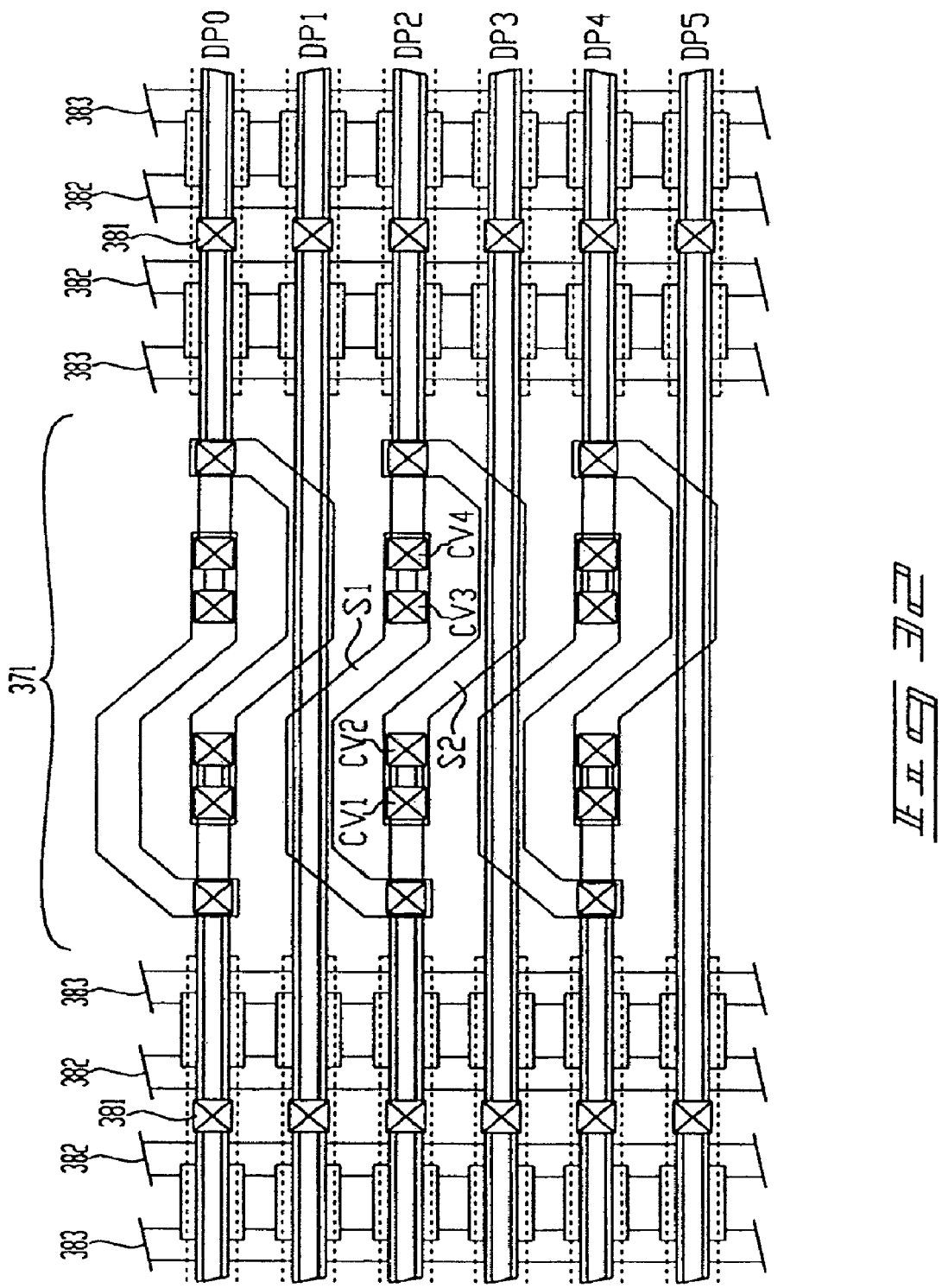

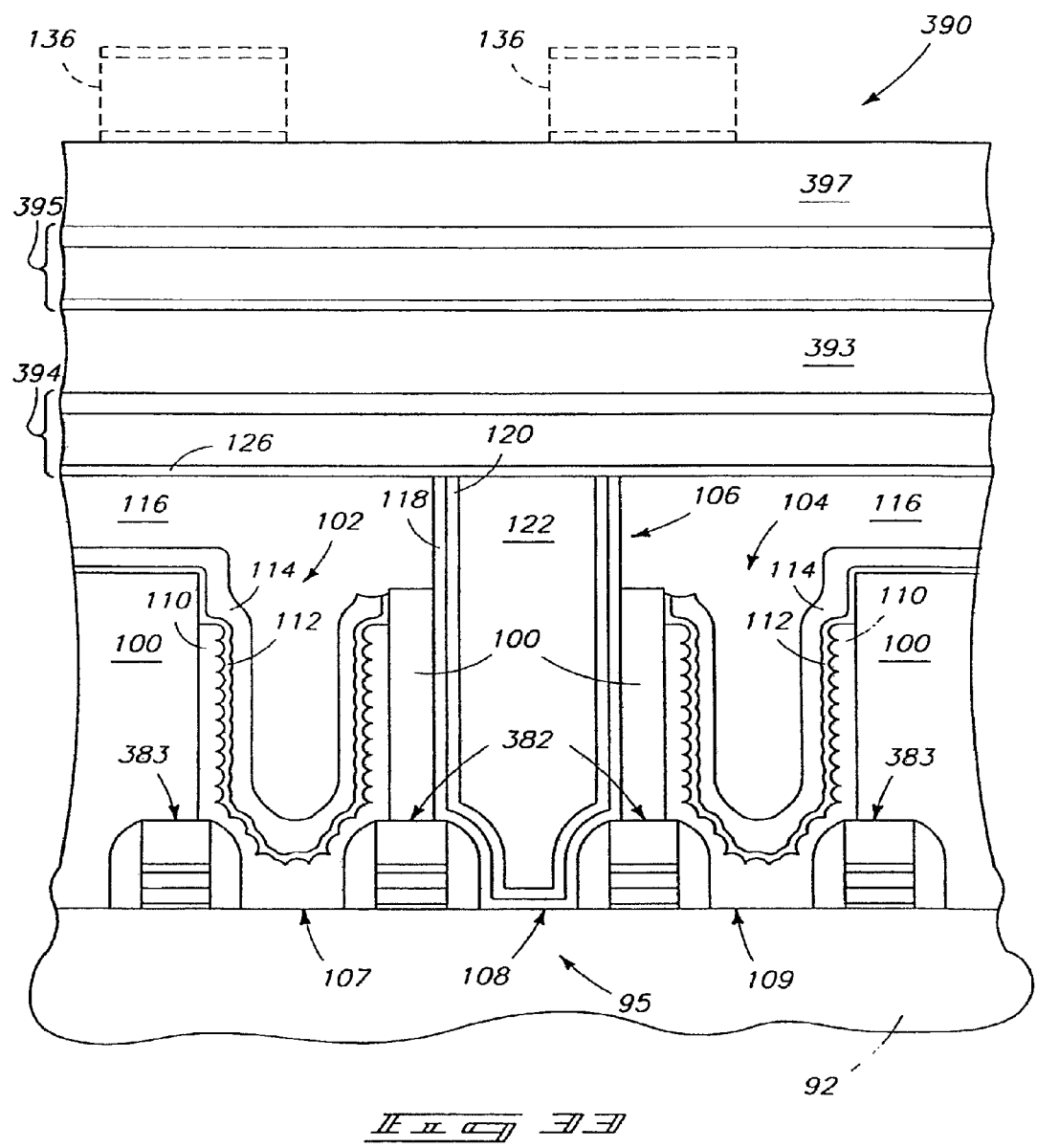

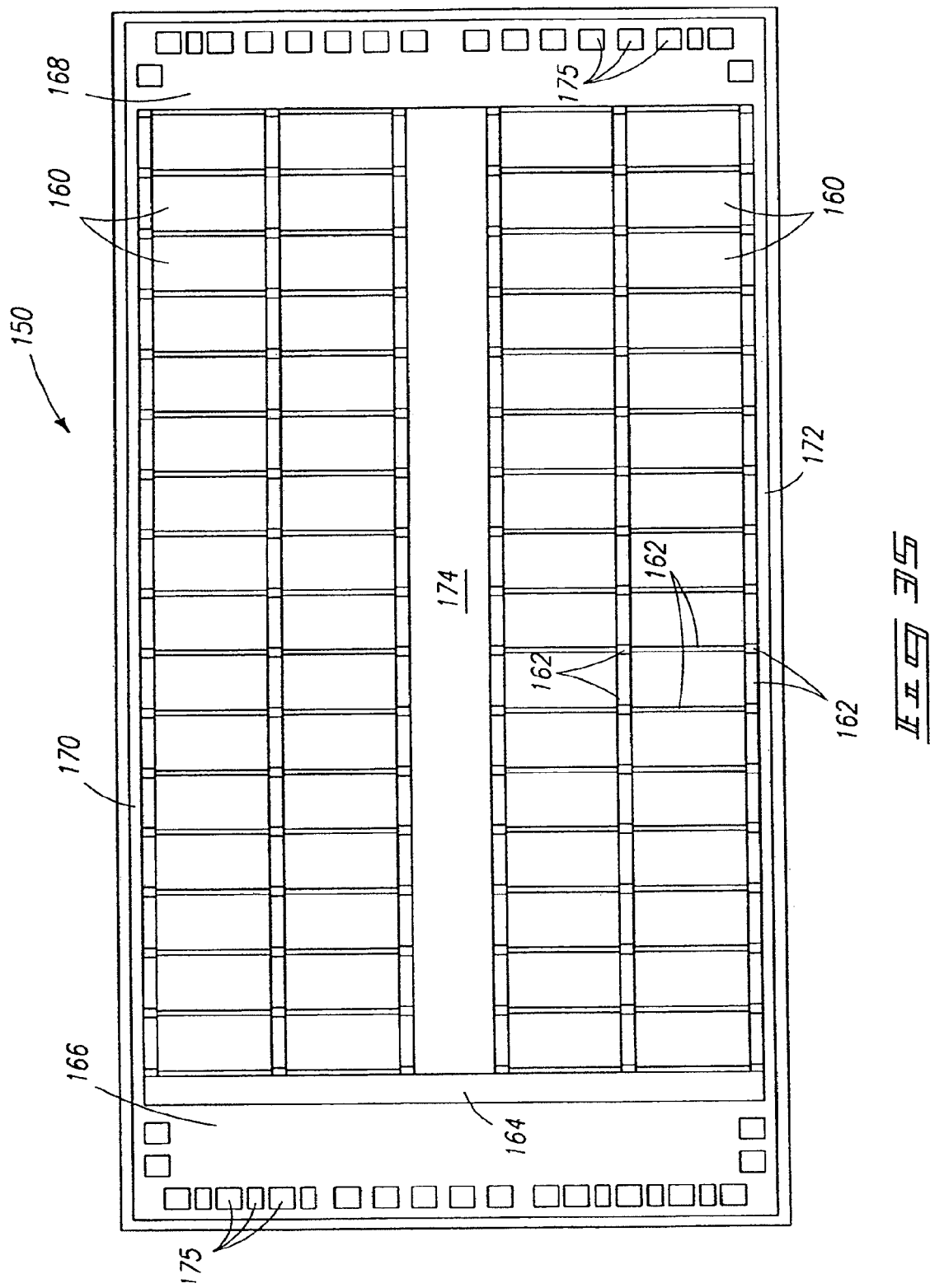

HIGH DENSITY INTEGRATED CIRCUITRY FOR SEMICONDUCTOR MEMORY HAVING MEMORY CELLS WITH A MINIMUM CAPABLE PHOTOLITHOGRAPHIC FEATURE DIMENSION

CROSS-REFERENCE TO RELATED APPLICATIONS

This application is a divisional of U.S. patent application Ser. No. 12/713,673, filed Feb. 26, 2010, and issued as U.S. Pat. No. 8,049,260 on Nov.1, 2011, which application is a continuation of U.S. patent application Ser. No. 08/530,661, filed Sep. 20, 1995, and issued as U.S. Pat. No. 7,705,383 on Apr. 27, 2010, the disclosures of which are hereby incorporated herein by this reference in its entirety.

BACKGROUND

1. Field of the Invention

This invention relates to semiconductor memory fabrication at the 64M, 16M and 4M integration levels.

2. State of the Art

High-density integrated circuitry is principally fabricated from semiconductor wafers. Upon fabrication completion, a wafer contains a plurality of identical discrete die areas which are ultimately cut from the wafer to form individual chips. Die areas or cut dice are tested for operability, with good dice being assembled into separate encapsulating packages which are used in end products or systems.

One type of integrated circuitry comprises memory. The basic unit of semiconductor memory is the memory cell. Capable of storing a single bit of information, the memory cell has steadily shrunk in size to enable more and more cells per area of a semiconductor substrate or wafer. Such enables integrated memory circuitry to be more compact, as well as faster in operation.

Examples of semiconductor memories include ROMs, RAMs, PROMs, EPROMs and EEPROMs. Some emphasize compactness and economy over speed. Others focus on lightning-fast operation. Some store data indefinitely, while others are so temporary they must be refreshed hundreds of time every second. The smallest memory cell comprises the single transistor and single capacitor of a dynamic random access memory (DRAM).

One industry-accepted manner of classifying a memory chip is by the number of final functional and operably addressable memory cells which are contained on a single chip. To maximize density, individual cells are arranged in multiple repeating memory arrays. DRAM fabrication has progressed to the point where millions of functional and operably addressable memory cells can be included in a single chip. Maximizing density of single transistor and other memory cells is a continuing goal in semiconductor memory fabrication.

With each new fabricating generation, the number of memory cells per die has historically increased by a factor of four. For example, what is commonly referred to as the 256K generation (262,144 addressable DRAM cells per chip) led to the 1M generation (1,048,576 addressable DRAM cells per chip). The 1M generation led next to the 4M generation (4,194,304 addressable DRAM cells per chip). The 4M generation led to the 16M generation (16,777,216 addressable DRAM cells per chip), which next led to the 64M generation (67,108,864 addressable DRAM cells per chip). The industry is presently working on the next factor of four generation, referred to as 256M (268,435,456 DRAM cells per chip), which has a memory cell pitch of 0.6 micron. Historically, with each generation, the number of addressable memory cells per chip increases exactly by a factor of four with an attendant increase in chip area. However, the increase in chip area has not been directly proportional to the increase in cells due to improved processing techniques which enable the individual memory cell size to be shrunk and thereby to increase in density. Nevertheless, each next generation puts four times the number of memory cells from the previous generation on a single chip.

BRIEF DESCRIPTION OF THE DRAWINGS

Preferred embodiments of the invention are described below with reference to the following accompanying drawings.

FIG. 1 is a diagrammatic sectional view of a semiconductor wafer fragment.

FIG. 2 is a view of the FIG. 1 wafer fragment shown at a processing step subsequent to that shown by FIG. 1.

FIG. 3 is a view of the FIG. 1 wafer fragment shown at a processing step subsequent to that shown by FIG. 2.

FIG. 4 is a view of the FIG. 1 wafer fragment shown at a processing step subsequent to that shown by FIG. 3.

FIG. 5 is a view of the FIG. 1 wafer fragment shown at a processing step subsequent to that shown by FIG. 4.

FIG. 6 is a view of the FIG. 1 wafer fragment shown at a processing step subsequent to that shown by FIG. 5.

FIG. 9 is a view of the FIG. 1 wafer fragment shown at a processing step subsequent to that shown by FIG. 8.

FIG. 10 is a diagrammatic top view of the wafer fragment shown in FIG. 9.

FIG. 11 is a view of the FIG. 1 wafer fragment shown at a processing step subsequent to that shown by FIG. 9.

FIG. 12 is a view of the FIG. 1 wafer fragment shown at a processing step subsequent to that shown by FIG. 11.

FIG. 13 is a diagrammatic sectional view of another semiconductor wafer fragment.

FIG. 14 is a view of the FIG. 13 wafer fragment shown at a processing step subsequent to that shown by FIG. 13.

FIG. 15 is a view of the FIG. 13 wafer fragment shown at a processing step subsequent to that shown by FIG. 14.

FIG. 16 is a diagrammatic sectional view of still another semiconductor wafer fragment.

FIG. 17 is a view of the FIG. 16 wafer fragment shown at a processing step subsequent to that shown by FIG. 16.

FIG. 18 is a view of the FIG. 16 wafer fragment shown at a processing step subsequent to that shown by FIG. 17.

FIG. 19 is a diagrammatic sectional view of yet another semiconductor wafer fragment.

FIG. 20 is a diagrammatic top view of the semiconductor wafer fragment shown in FIG. 19.

FIG. 21 is a diagrammatic sectional view of yet still another semiconductor wafer fragment.

FIG. 22 is a diagrammatic top view of the semiconductor wafer fragment shown in FIG. 21.

FIGS. 31 and 32 are top diagrammatic and schematic views of memory circuitry layouts.

FIG. 33 is a diagrammatic sectional view of a semiconductor wafer fragment as would be positionally taken along and through the digit line of FIG. 26.

FIG. 35 is a diagrammatic view of a circuitry layout for a semiconductor memory device.

DETAILED DESCRIPTION OF THE INVENTION

Figure 7:
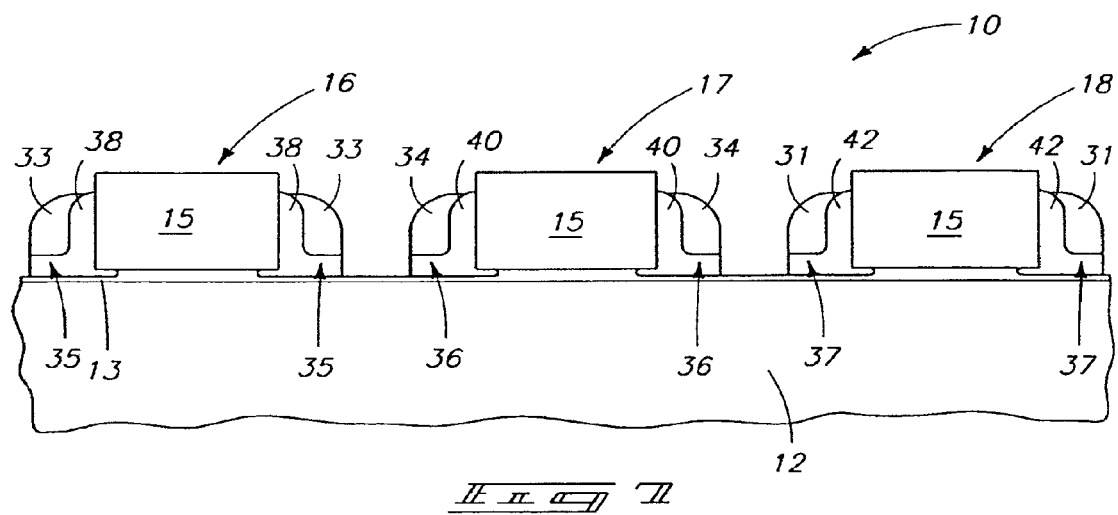
FIG. 7 is a view of the FIG. 1 wafer fragment shown at a processing step subsequent to that shown by FIG. 6.

This disclosure of the invention is submitted in furtherance of the constitutional purposes of the U.S. Patent Laws "to promote the progress of science and useful arts" (Article 1, Section 8).

Implementing memory and other electronic circuitry involves connecting isolated devices through specific electric paths. Further, it is necessary to electrically isolate devices built into the substrate from one another. Electrical isolation of devices as circuit density increases is a continuing challenge.

One method of isolating devices involves the formation of a semi-recessed or fully recessed oxide in the nonactive (or field) area of the substrate. These regions are typically termed as "field oxide" and are formed by LOCal Oxidation of exposed Silicon, commonly known as LOCOS. One approach in forming such oxide is to cover the active regions with a thin layer of silicon nitride that prevents oxidation from occurring therebeneath. A thin intervening layer of a sacrificial pad oxide is provided intermediate the silicon substrate and nitride layer to alleviate stress and protect the substrate from damage during subsequent removal of the nitride layer. The unmasked or exposed field regions of the substrate are then subjected to a wet $H_2O$ oxidation, typically at atmospheric pressure and at temperatures of around 1000° for two to four hours. This results in field oxide growth where there is no masking nitride.

However, at the edges of the nitride, some oxidant also diffuses laterally. This causes the oxide to grow under and lift the nitride edges. Because the shape of the oxide at the nitride edges is that of a slowly tapering oxide wedge that merges into another previously formed layer of oxide, it has commonly been referred to as a "bird's beak." The bird's beak is a lateral extension or encroachment of the field oxide into the active areas where the devices are formed. Although the length of the bird's beak depends upon a number of parameters, the length is typically 0.15 micron to 0.5 micron per side.

This thinner area of oxide resulting from the bird's beak provides the disadvantage of not providing effective isolation in these regions and, as well, unnecessarily consumes precious real estate on the semiconductor wafer. Further, as the circuit density (commonly referred to as minimum device pitch) falls below 1.0 micron, conventional LOCOS techniques fail due to excessive encroachment of the oxide beneath the masking stack. The closeness of the masking block stacks in such instances results in effective joining of adjacent bird's beaks, thus effectively lifting the stacks and resulting in no masking effect to the oxidation.

This disclosure provides an alternate technique which enables use of a dry, high pressure, $O_2$ oxidizing ambient for oxidizing conditions to minimize bird's beak encroachment. This disclosure also provides an alternate technique of forming field oxide regions in a manner which favorably minimizes bird's beak size. This disclosure also provides an alternate technique enabling elimination of field oxide regions between certain adjacent memory cells.

Further, the reduction in memory cell size required for high-density DRAMs results in a corresponding decrease in the area available for the storage node of the memory cell capacitor. Yet, design and operational parameters determine the minimum charge required for reliable operation of the memory cell despite decreasing cell area. Several techniques have been developed to increase the total charge capacity of the cell capacitor without significantly affecting the cell area. These include structures utilizing trench and container-shaped stacked capacitors.

This disclosure provides an alternate technique which enables capacitance to be maximized within a given area. This disclosure also provides an alternate technique enabling closer mask opening tolerances by reducing mask misalignment spacing between adjacent devices.

The area on a substrate consumed by memory integrated circuitry is impacted by the number of conductive layers which are provided for producing the circuitry. Generally, the lower the number of conductive line layers, the simpler the process but the greater the area consumed by the memory cell. The substrate area consumed by the memory cells can be reduced by providing more conductive line layers, but at the expense of process complexity.

This disclosure provides an alternate technique of using a comparatively larger number of conductive line layers enabling taking full advantage of the elimination of field oxide regions between certain adjacent memory cells as alluded to above.

One or more of the above-described techniques, or other techniques, can be utilized in the production of 64M, 16M or 4M memory chips in accordance with the invention, with the invention only being limited by the accompanying claims appropriately interpreted in accordance with the doctrine of equivalents.

The discussion initially proceeds with description of processes for forming field oxide regions in manners which minimize bird's beak encroachment into substrate active areas. FIG. 1 illustrates a semiconductor wafer fragment in process for formation of a pair of adjacent field oxide regions having a minimum pitch of less than or equal to 0.7 micron, and is indicated generally with reference numeral 10. Such is comprised of a starting bulk semiconductor silicon substrate 12. A sacrificial pad oxide layer 14 is thermally grown over semiconductor silicon substrate 12 to a thickness of from 20 Angstroms to 100 Angstroms. A nitride masking layer 15, preferably $Si_3N_4$, is provided over sacrificial pad oxide layer 14 to a thickness of from 500 Angstroms to 3000 Angstroms. The function of sacrificial pad oxide layer 14 is to cushion the transition of stresses between silicon substrate 12 and nitride masking layer 15. Nitride masking layer 15 will function as a masking layer for ultimate formation of the field oxide regions.

Referring to FIG. 2, nitride masking layer 15 has been patterned and etched as shown to form nitride masking blocks 16, 17 and 18. A channel-stop implant can be conducted prior to removing the illustrated nitride masking blocks. The etch to produce nitride masking blocks 16, 17 and 18 is substantially selective to sacrificial pad oxide layer 14. However, the etch does result in removal of a portion of sacrificial pad oxide layer 14 in an uneven manner due in part to the inherent preferred thinness of sacrificial pad oxide layer 14. Nitride masking blocks 16, 17 and 18 are provided to define and thereby overlie desired active area regions on the silicon substrate 12. The illustrated nitride masking blocks 16, 17, and 18 provide an example of a preferred minimum pitch 20 of adjacent blocks of less than or equal to 0.7 micron, with 0.6 micron being a specific example.

Referring to FIG. 3, the wafer fragment 10 is preferably subjected to a wet isotropic etch to remove remaining portions of exposed sacrificial pad oxide layer 14 from the silicon substrate 12. This also produces undercut etching of sacrificial pad oxide layer 14 beneath nitride masking blocks 16, 17 and 18, as shown.

Referring to FIG. 4, the wafer fragment 10 is subjected to oxidizing conditions to grow a preferred second sacrificial oxide layer 13 having a thickness of from 60 Angstroms to 120 Angstroms. Layer 13 will function as a silicon etch stop, as will be apparent subsequently. The thickness of layer 13 has an effect on the resultant bird's beak size. The thicker the layer 13, the larger the bird's beak size after field oxidation.

Referring to FIG. 5, a layer 30 of silicon is provided over patterned nitride masking blocks 16, 17 and 18 and over second sacrificial oxide layer 13. A preferred material for layer 30 is polysilicon deposited to a thickness ranging from 200 Angstroms to 1000 Angstroms. Alternate materials, by way of example only, include amorphous silicon and porous silicon. Subsequently, a second masking layer 32 is provided over silicon layer 30 also to a preferred thickness of from 200 Angstroms to 1000 Angstroms. Layer 32 preferably constitutes a material which is selectively etchable relative to underlying silicon layer 30. Examples of preferred materials include $SiO_2$ and $Si_3N_4$, with $SiO_2$ being more preferred. The thickness of layer 32 is used to set the length of the foot portion independent of the first spacer height, as will be apparent subsequently.

Referring to FIG. 6, second masking layer 32 is anisotropically etched to define pairs 33, 34 and 31 of second masking layer sidewall spacers over silicon layer 30 and to outwardly expose portions of silicon layer 30. The anisotropic etch is preferably conducted selectively relative to silicon layer 30, as shown. Pairs 33, 34 and 31 of second masking layer sidewall spacers define interconnected respective pairs 35, 36 and 37 of respective masked laterally opposed and outwardly projecting foot portions of silicon layer 30.

Referring to FIG. 7, exposed portions of silicon layer 30 are anisotropically etched selectively relative to second sacrificial oxide layer 13 to form respective pairs 38, 40 and 42 of silicon sidewall spacers. Silicon sidewall spacer pair 38 includes laterally opposed and laterally outwardly projecting foot portion pair 35. Silicon sidewall spacer pair comprises laterally opposed and laterally outwardly projecting foot portion pair 36. Silicon sidewall spacer pair includes laterally opposed and laterally outwardly projecting foot portion pair 37.

Figure 8:
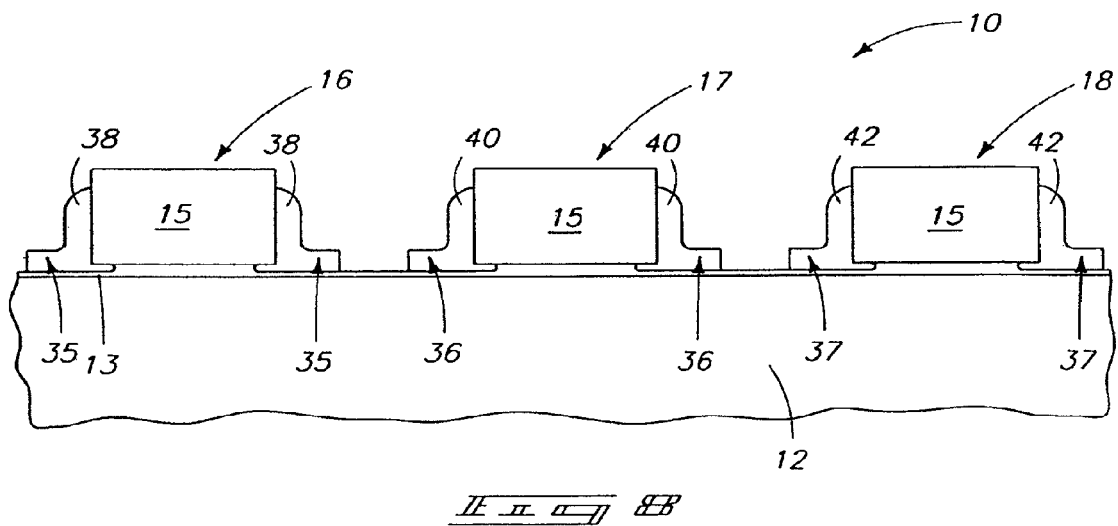
FIG. 8 is a view of the FIG. 1 wafer fragment shown at a processing step subsequent to that shown by FIG. 7.

Referring to FIG. 8, second masking layer sidewall spacer pairs 33, 34 and 31 are stripped from the silicon substrate 12. Alternately, these spacers can remain at this point in the process and be stripped after field oxidation. Further, as an alternative, second masking layer sidewall spacer pairs 33, 34 and 31 might remain after field oxidation. Most preferred is removal of such spacers now as shown in FIG. 8.

Referring to FIG. 9, the wafer is subjected to oxidizing conditions which oxidize the silicon of bulk silicon substrate 12 and silicon sidewall spacer pairs 38, 40 and 42 to form the illustrated field oxide regions 44, 45. Any of a number of oxidizing conditions might be used. One example includes oxidizing in an $O_2$ ambient at a pressure of at least 15 atmospheres. The atmosphere will preferably be essentially void of $H_2O$ during the oxidizing and constitutes essentially pure $O_2$ or $O_2$ injected into the reactor in combination with a carrier gas, such as $N_2$ or Ar. The preferred upper pressure limit for such an oxidation is 50 atmospheres, with 25 atmospheres being a more preferred condition. The preferred temperature range during such an oxidation is from 950° C. to 1300° C. Growth rate in such a dry oxygen ambient at 25 atmospheres pressure at 1000° C. is 4000 Angstroms per 70 minutes. Such oxidation is preferably conducted to provide field oxide regions 44 and 45 to have a location of maximum thickness of from 1500 Angstroms to 3000 Angstroms. As depicted, field oxide regions 44 and 45 define substrate active area 25 therebetween. During field oxidation, a very thin layer of oxide (20 to 200 Angstroms, not shown) may form atop nitride masking blocks 16, 17 and 18 from transformation of the $Si_3N_4$ to $SiO_2$.

Also during oxidation, silicon sidewall spacer pairs 38, 40 and 42, being of a silicon material similar to silicon substrate 12, are also oxidized and grow in volume to approximately twice their original size. This results in formation of what is referred to as "Mickey Mouse" ears 46. However, the preferred 200 Angstroms to 1000 Angstrom thin nature of silicon layer 30, which ultimately forms silicon sidewall spacer pairs 38, 40 and 42, results in smaller (thinner) "Mickey Mouse" ears 46. This provides the subsequent advantage of minimizing upper topography of the resultant field oxide regions 44 and 45. Further, the elongated nature of foot portion pairs 35, 36 and 37 (FIG. 8) advantageously provides adequate lateral displacement to prevent significant oxygen encroachment to minimize bird's beak formation beneath nitride masking blocks 16, 17 and 18.

FIG. 10 illustrates a diagrammatic top view of FIG. 9 emphasizing the illustrated field oxide regions 44 and 45, and active area 25 therebetween. A staggered layout of the active area regions is preferably utilized, with preferred minimum pitch 20 being the minimum pitch between the most closely adjacent field oxide regions 44 and 45. The staggering produces a wider pitch 21 (FIG. 10 only) between further spaced adjacent field oxide regions 44 and 45, as shown. During field oxidation, the location of maximum field oxide thickness typically occurs centrally relative to the respective widths of the regions along the wider pitch 21. Field oxide thickness is typically less along preferred minimum pitch 20, where substrate stress is greater due to closeness of the adjacent nitride masks.

FIG. 11 illustrates stripping of nitride masking blocks 16, 17 and 18 from the silicon substrate 12, and subsequent stripping of second sacrificial oxide layer 13. Further, essentially any remnants of sacrificial pad oxide layer 14 which might be remaining would also be removed. In the course of such removals, any oxide formed atop nitride masking blocks 16, 17 and 18 would be removed, resulting in removal of oxide from atop field oxide regions 44 and 45 in quanta of from 50 Angstroms to 250 Angstroms. Further, removal of layer 13 will preferably remove an additional 50 Angstroms to 500 Angstroms of oxide from the field regions. Such also advantageously results in reduced ears 46a. Subsequently, a third sacrificial oxide layer 48 is preferably grown (i.e., from 150 Angstroms to 350 Angstroms over the silicon substrate) to eliminate the undesired formation of the silicon-nitride during the field oxidation (commonly referred to as the "Kooi effect"). Such oxide growth results in an estimated growth of field oxide regions 44 and 45 of from 50 Angstroms to 200 Angstroms.

Referring to FIG. 12, third sacrificial oxide layer 48 is stripped from the silicon substrate 12, which also etches from 200 Angstroms to 400 Angstroms of field oxide regions 44 and 45, and desirably has the effect of essentially eliminating the remaining sharp points of reduced ears 46a to produce an upper smooth topography for such field oxide regions. Thus, bird's beak encroachment into the active area 25 is minimized. Field oxide regions 44 and 45 might also alternatively be provided to be recessed relative to bulk silicon substrate 12.

The discussion next proceeds regarding improved techniques for roughening polysilicon surfaces for use in enhancing capacitance in capacitor constructions. More particularly and initially with reference to FIGS. 13 through 15, a semiconductor wafer fragment in process is indicated generally with reference numeral 50, each comprising a bulk semiconductor substrate 52 (typically p-doped monocrystalline silicon) having an n-type diffusion region 54 provided therein. Diffusion region 54 comprises a node to which electrical connection to a capacitor plate is to be made. A layer 56 of insulative silicon dioxide is provided over bulk semiconductor substrate 52 and is provided with a container opening 58 therein to diffusion region 54. The wafer is placed within a chemical vapor deposition reactor, and a layer 60 of in situ conductively doped amorphous silicon is chemical vapor deposited over the depicted substrate at a first temperature, which is below 600° C.

An example of a preferred process for providing layer 60 would be to place the wafer in a six-liter reactor with the wafer maintained at 560° C. and a reactor pressure at 80 Torr. $SiH_4$ and phosphine are fed to the reactor at respective flow rates of 500 sccm and 300 sccm for 400 seconds. Such will produce a layer 60 having a thickness of approximately 1,000 Angstroms. By way of example only, disilane could be substituted for $SiH_4$ at a flow rate of 300 sccm while the other parameters remain constant. Such will produce layer 60 to approximately 1,000 Angstroms in 15 seconds. For purposes of the continuing discussion, doped amorphous silicon layer 60 has an outer surface 62 of a first degree of roughness.

Referring to FIG. 14, the substrate temperature within the reactor is raised at a selected rate to an annealing second temperature which is between 550° C. and 950° C. The bulk semiconductor substrate 52 is maintained at the second annealing temperature for a period of time sufficient to convert doped amorphous silicon layer 60 into a doped polysilicon layer 65 having an outer surface 64 of a second degree of roughness which is greater than the first degree of roughness. Bulk semiconductor substrate 52 is not removed from the reactor nor exposed to any oxidizing conditions between the time of deposition of amorphous silicon layer 60 and its conversion to polysilicon layer 65.

The selected ramp rate for the temperature increase is preferably less than or equal to 10° C./sec. Ramp rates of 30° C. and 40° C. were also utilized and while a roughness increase of outer surface 62 to outer surface 64 was observed, the increase was not as significant as where the ramp rate was kept at a lower rate of at or below 10° C./sec. The annealing second temperature is also kept at preferably below 700° C. to minimize the thermal budget on the wafer during processing.

The reactor ambient during the annealing process is preferably kept at a vacuum pressure. Alternately, an inert atmosphere of, for example, $N_2$ can be utilized. Preferably, the reactor pressure during the amorphous silicon deposition and annealing steps is the same pressure, with such being greater than 0.01 Torr. Where an inert gas is provided within the reactor during the annealing step, reactor pressures of greater than or equal to 760 Torr can be utilized.

Actual anneals were conducted at wafer temperatures of 650° C., 660° C., 670° C., 680° C., 700° C., 750° C., 800° C. and 850° C. Reactor pressures were varied from 400 mTorr to 80 Ton with and without $N_2$. Deposition times ranged from 30 seconds to 900 seconds. Temperature ramp rates between the amorphous silicon deposition and the annealing ranged from 4° C./sec to 10° C./sec. The best results at producing maximized surface roughness of outer surface 64 as compared to original outer surface 62 occurred at 670° C. for between 30 and 60 seconds, where the ramp rate between deposition and anneal was approximately 5° C./sec.

Such a resultant surface is advantageously used in the formation of improved capacitor constructions in memory circuitry. FIG. 15 illustrates a dielectric layer 67 and subsequently deposited outer capacitor plate 68 (conductively doped polysilicon) provided to complete formation of a capacitor construction 59.

FIGS. 16 through 18 illustrate an alternate embodiment construction and process which incorporate at least one additional process step over that depicted by FIGS. 13 through 15. Like numbers from the embodiment of FIGS. 13 through 15 are utilized where appropriate, with differences being indicated with the suffix "a" or with different numerals. FIG. 16 illustrates the same essential wafer fragment 50a incorporating additional features and at a processing step subsequent to that shown by FIG. 13. Specifically, and after provision of in situ doped amorphous silicon layer 60, the substrate temperature is raised at a selected rate to an intermediate silicon seeding temperature. At the seeding temperature, a discontinuous layer of silicon particles 69 is provided atop doped amorphous silicon layer 60. This occurs within the same reactor and without any intervening exposure of the wafer to oxidizing conditions between the time of amorphous silicon deposition and provision of the discontinuous seeding particles. The seeds constitute discrete clusters of silicon atoms.

A preferred process for providing the silicon particles is to feed a silicon source gas to the reactor which comprises a gaseous compound of the formula $Si_nH_{2n+2}$, where "n" is an integer greater than or equal to 1. An exemplary process in accordance with the above-described embodiment would be to feed disilane gas to the reactor at a rate of 5 sccm to 10 sccm for from 30 to 60 seconds. Preferably, discontinuous silicon particles 69 are provided to have a particle diameter of from 10 Angstroms to 50 Angstroms. An exemplary seeding temperature is 600° C., with the selected first ramp rate to the seeding temperature being at or below 10° C./sec. The silicon seeding temperature is preferably at or below 600° C. The result is production of an inherently rougher outer surface 62a than outer surface 62 of the previous embodiment.

Referring to FIG. 17, the bulk semiconductor substrate 52, again within the same chemical vapor deposition reaction and without any intervening exposure of the wafer to oxidizing conditions, has its temperature raised at a second selected rate to the annealing temperature, which is between 550° C. and 950° C. Again, the preferred rate is at or below 10° C./sec. The substrate is maintained at the annealing temperature for a period of time sufficient to convert the doped amorphous layer into a doped polysilicon layer 65a having outer surface 64a, with such outer surface having a second degree of roughness which is greater than the first degree of roughness of amorphous silicon layer outer surface 62a.

An advantageous phenomenon occurs in utilization of silicon particles 69. The amorphous silicon of layer 60 migrates on outer surface 62a and agglomerates onto the silicon seeds/particles 69, creating bumps and valleys and therefore an outer polysilicon surface having even greater roughness. FIG. 17 depicts the silicon particles 69 as being discrete at the conclusion to the annealing processing step. More typically, such particles would no longer exist as discrete particles and would rather constitute a part of the homogeneously formed polysilicon crystal lattice of doped polysilicon layer 65a. An exemplary annealing temperature wherein a silicon seeding temperature of 600° C. is utilized would be 630° C. Also possible in accordance with the invention, the annealing temperature and seeding temperature might be the same temperature, such that the second selected temperature ramp rate is 0° C./sec.

Referring to FIG. 18, a capacitor dielectric layer 67a and outer capacitor plate layer 68a are provided to produce a resultant capacitor construction 59a. Layers 67a and 68a will have a slightly greater roughness than the first described embodiment due to the enhanced roughening produced by the silicon seeding process.

One additional problem associated with density maximization of memory circuitry concerns required spacing which is provided between adjacent devices, such as between a bit line contact and a capacitor construction. The problem is best understood with reference to FIGS. 19 and 20.

FIG. 19 illustrates a semiconductor wafer fragment comprising a pair of DRAM container capacitors 72 and 74 having a bit contact plug 75 extending vertically therebetween. Other typical circuit components, such as field oxide regions, bulk substrate and an overlying bit line, are not shown or described as such are not particularly pertinent to the points here being made. Each capacitor 72, 74 is formed within a respective container opening 76 within a previously provided insulating dielectric layer. Each comprises a storage node plate 78 and an overlying capacitor dielectric layer 80. A capacitor cell plate, common to both capacitors, is typically provided in the form of an electrically conductively doped polysilicon layer 82. Layer 82 effectively comprises a sheet as-deposited, with essentially all cell plates of the capacitors being electrically connected to or constituting a part of this sheet.

However, contact openings or holes are cut through the sheet at certain locations to enable electrical connection with areas lower in the substrate, such as for the illustrated bit contact plug 75. Such is accomplished by providing an opening in layer 82, as is depicted by a mask opening outline 84. Subsequently, a bit contact 86 is provided laterally within the confines of mask opening outline 84. Accordingly, the resultant bit contact plug 75 will be effectively electrically isolated from layer 82.

The above-illustrated openings 76, 84 and bit contact 86 are provided by three different and separate photolithographic masks. Due to the possibility of mask misalignment, tolerance for mask misalignment must be provided relative to each mask such that certain masks will not overlap with one another. For example, spacing "x" provides for an area for relative misalignment of the masks to produce mask opening outline 84 and bit contact 86 relative to one another. Further, spacing "y" is provided to assure misalignment tolerance for the container opening 76 etch verses the mask opening outline 84 etch. Typically, the misalignment tolerance for both spacings "x" and "y" is 0.15 micron, providing for a true spacing between bit contact plug 75 and storage node plate 78 of 0.3 micron. However, 0.3 micron is more than what is required to provide sufficient electrical isolation between the contact plug and the adjacent capacitors, resulting in greater real estate being consumed for a pair of adjacent memory cells than is otherwise required.

Figure 23:
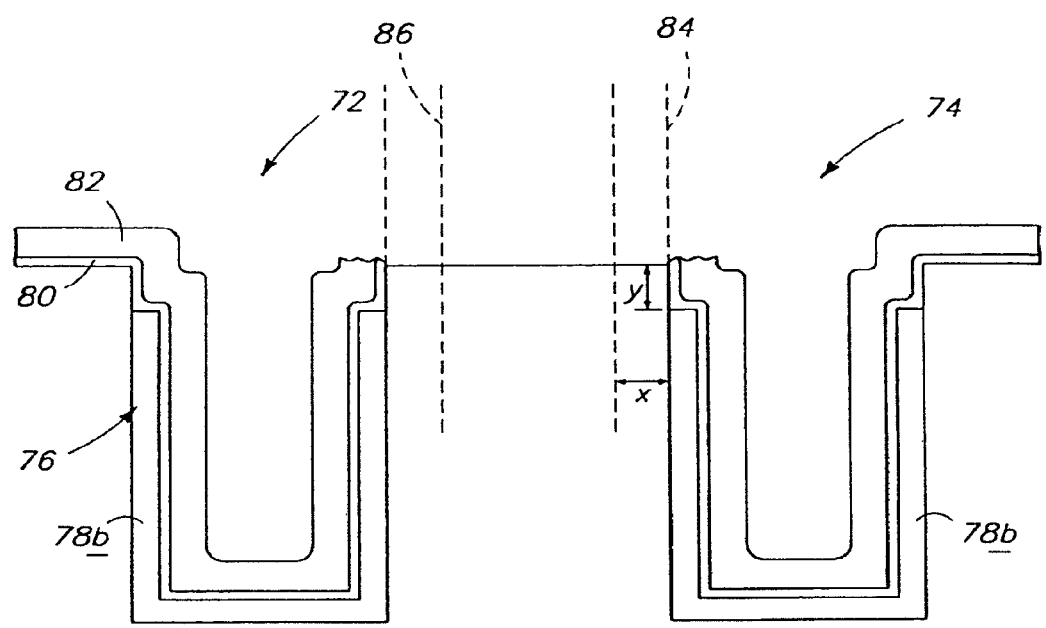
FIG. 23 is a view of the FIG. 21 wafer fragment shown at a processing sequence subsequent to that shown by FIG. 21.

Such extra spacing can be overcome to a degree in a manner described with reference to FIGS. 21-23. Like numerals from the embodiment of FIGS. 19 and 20 are utilized where appropriate, with differences being indicated by the suffix "b" or with different numerals. Specifically, the lateral or horizontal misalignment tolerance between the respective container openings 76 and the adjacent mask opening outline 84 are reduced on each side of bit contact 86 opening by a factor of the "y" spacing. Thus, in connection with the described embodiment, the adjacent pair of container openings 76 can be placed 0.3 micron closer to one another, thus increasing circuit density. Such is essentially accommodated for by allowing or providing for the misalignment tolerance of spacing "y" to be in a vertical direction as opposed to a horizontal direction.

Specifically, capacitor storage node containers 78b are recessed relative to the upper surface of the capacitor dielectric layer 80 at least by the misalignment tolerance distance "y." Thereby, true mask misalignment tolerance for mask opening outline 84 is equal to twice the sum of the thicknesses of doped polysilicon layer 82 and dielectric layer 80. FIG. 21 illustrates essentially perfect alignment of mask opening outline 84 relative to the distance between container openings 76, with mask opening outline 84 corresponding in lateral expanse to the distance between the closest distance between container openings 76.

FIG. 21 illustrates an etch of doped polysilicon layer 82 which would otherwise occur if an anisotropic etch were conducted through mask opening outline 84 relative to doped polysilicon layer 82. However, as shown in FIG. 23, the etch through mask opening outline 84 is conducted to be isotropic. This will undercut polysilicon layer 82 beneath the photoresist to cause further displacement of the edge of doped polysilicon layer 82 relative to the edge of bit contact 86. Thus adequate "x" and "y" misalignment spacing is provided relative to the storage node, sheet opening and bit line contacts by extending the "y" misalignment tolerance substantially vertically as opposed to horizontally. There will be an associated loss in capacitance due to recessing of capacitor storage node containers 78b, which effectively shrinks the size of containers 78b.

Figure 24:
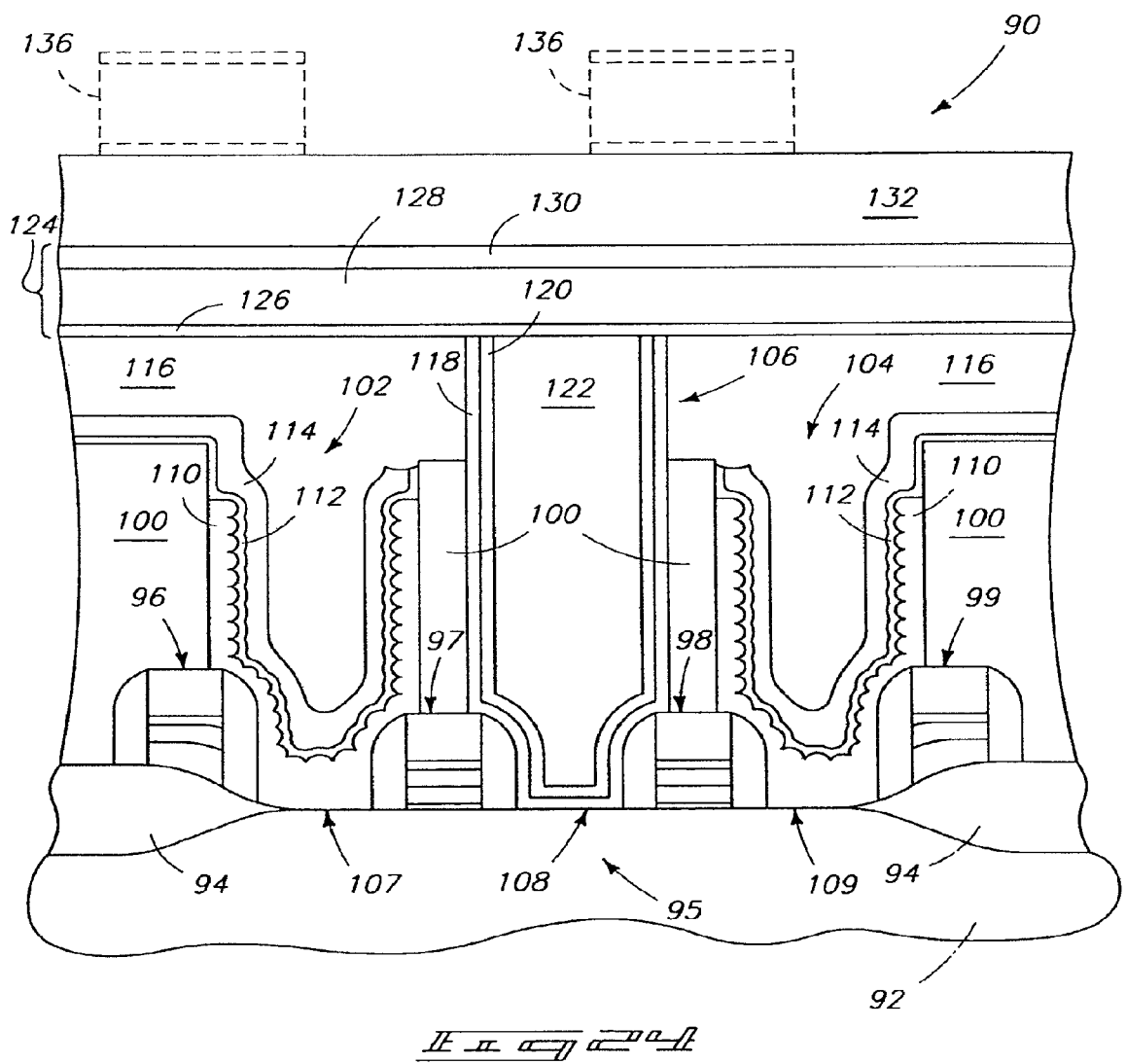
FIG. 24 is a diagrammatic sectional view of another semiconductor wafer fragment.

An example of integration of one or more of the above processes is described with reference to FIGS. 24 and 25. Such illustrates a semiconductor wafer fragment 90 comprised of a bulk substrate 92 and field oxide regions 94. Preferably, field oxide regions 94 are produced in accordance with the above-described processes to minimize bird's beak encroachment. The area between field oxide regions 94 constitutes active area 95. A series of four word lines 96, 97, 98 and 99 are illustrated in FIG. 24. Each is comprised of a composite of five layers, namely, a gate oxide layer, a conductively doped polysilicon layer, a WSi$_x$ layer, an oxide layer, and an Si$_3$N$_4$ capping layer. Electrically insulative sidewall spacers, typically formed of Si$_3$N$_4$, are also provided relative to the respective word lines, as shown.

An insulating dielectric layer 100, typically borophosphosilicate glass (BPSG), is provided outwardly of the illustrated word lines. A pair of container capacitor constructions 102 and 104 is provided as shown. An intervening bit contact plug 106 extends vertically between capacitor constructions 102 and 104. The illustrated construction constitutes two memory cells of a DRAM array, with such cells sharing a bit contact and an intervening substrate diffusion region (not shown). Contacts 107, 108, and 109 for the respective components to bulk substrate 92 are provided as shown.

Each capacitor construction 102, 104 is preferably constructed by a combination of the processes provided above. For example, each comprises a storage node 110 constituting conductively doped polysilicon preferably deposited to have a rough outer surface as described above. Further, each storage node 110 is preferably recessed relative to the outer surface of insulating dielectric layer 100 to enable the lateral expanse of the wafer consumed by mask misalignment tolerance to be reduced as described above. Such facilitates placing of capacitor constructions 102, 104 and bit contact plug 106 closer to one another. A capacitor dielectric layer 112 and outer conductive cell polysilicon layer 114 are provided as shown.

An insulating dielectric layer 116, typically BPSG, is provided outwardly of capacitor constructions 102 and 104. Bit contact plug 106 provided therethrough and through insulating dielectric layer 100 to contact 108. Bit contact plug 106 preferably comprises the illustrated composite of layer 118 of titanium, layer 120 of TiN as a barrier layer, and layer 122 of elemental tungsten. Where layer 118 interfaces with bulk substrate 92, a conductive $WSi_x$ forms.

Insulating dielectric layer 116 is provided with a planarized outer surface atop which a digit line 124 is provided. Such is illustrated as a simple line in FIG. 25 for clarity. Digit line 124 would typically comprise a composite of a lower adhesion layer 126 of titanium, a bulk mass conductive layer 128 of aluminum or an aluminum alloy, and an outer antireflective coating layer 130 of TiN. In this described embodiment, all digit lines of the array would be provided at the same essential level as digit line 124.

Another insulating dielectric layer 132 is provided outwardly of digit line 124 and is provided with a planarized outer surface. Composite-patterned electrically conductive runners 136 are shown outwardly of insulating dielectric layer 132 (FIG. 24). Such conductive runners typically are not utilized as part of the DRAM memory array, but are utilized in the pitch and the peripheral circuitry of such arrays.

Figure 25:
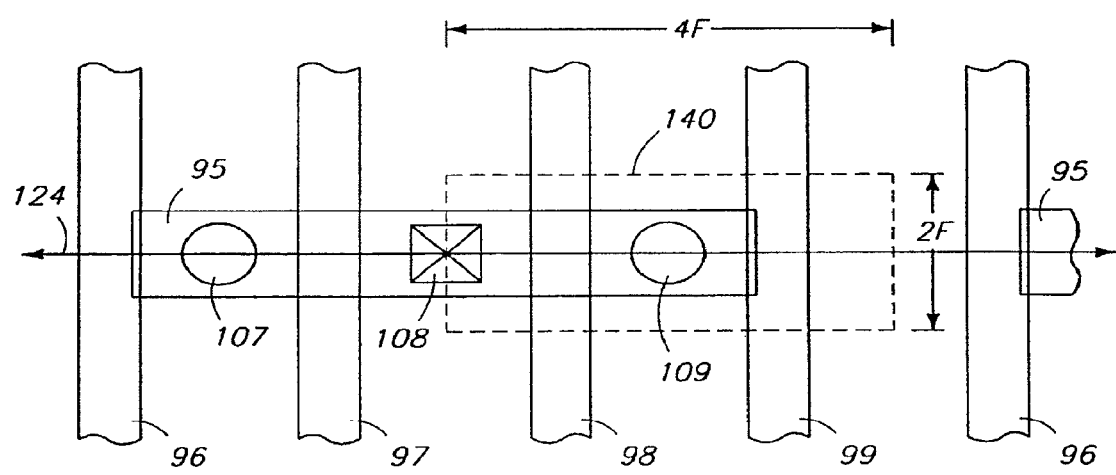
FIG. 25 is a diagrammatic top view of the semiconductor wafer fragment shown in FIG. 24.

FIG. 25 illustrates, by dashed outline, the area that is consumed by a single memory cell in accordance with this embodiment. Such area can be considered or described as relative to a minimum capable photolithographic feature dimension "F." As shown, a single memory area 140 is 4F wide by 2F deep, thus providing a consumed area for a single memory cell of $8F_2$.

The FIG. 24 circuit constitutes a die which is fabricated to include four composite conductive line layers. The first of those layers constitutes composite word lines 96, 97, 98 and 99 which are collectively formed from the same essential processing steps. The second composite conductive line layer constitutes cell polysilicon layer 114. Within the memory array, such a layer can be considered as constituting a sheet through which isolated waffle-like openings (i.e., the mask opening outlines 84 of the previously described embodiment) are provided for provision of isolated bit contact plugs 106 therethrough. Yet in the area of the peripheral circuitry or the pitch circuitry to the memory array, cell polysilicon layer 114 would be patterned to form one or more conductive lines to provide desired electrical interconnection.

The third composite conductive line layer constitutes digit lines 124, while the fourth conductive line layer constitutes the composite peripheral conductive runners 136.

This disclosure further provides an alternative process which enables elimination of field oxide regions within the memory array, thus facilitating greater circuit density. As background, field oxide regions provide electrical isolation between certain adjacent banks of memory cells within the array. Field oxide by definition defines breaks in the active area formed within the bulk substrate between adjacent cells. For example, see FIG. 25, which shows a break between the two adjacent active areas 95. Such results from field oxide aimed therebetween, with the illustrated word lines 96 and 99 running atop such field oxide region for gating a staggered set of memory cells within the array. The lateral expanse of the field oxide and word lines 96 and 99 for the staggered active area array constitute circuit area which is consumed on a semiconductor substrate. Specifically, each memory cell of a DRAM array has 1.5 times the minimum photolithographic feature size, F, of its lateral expanse consumed by field oxide and the area for word lines 96 and 99. In accordance with one preferred aspect of this disclosure, memory cell area devoted to electrical isolation from an adjacent cell and to word lines 96 and 99 can be reduced from 1.5F to 0.5F.

Figure 26:
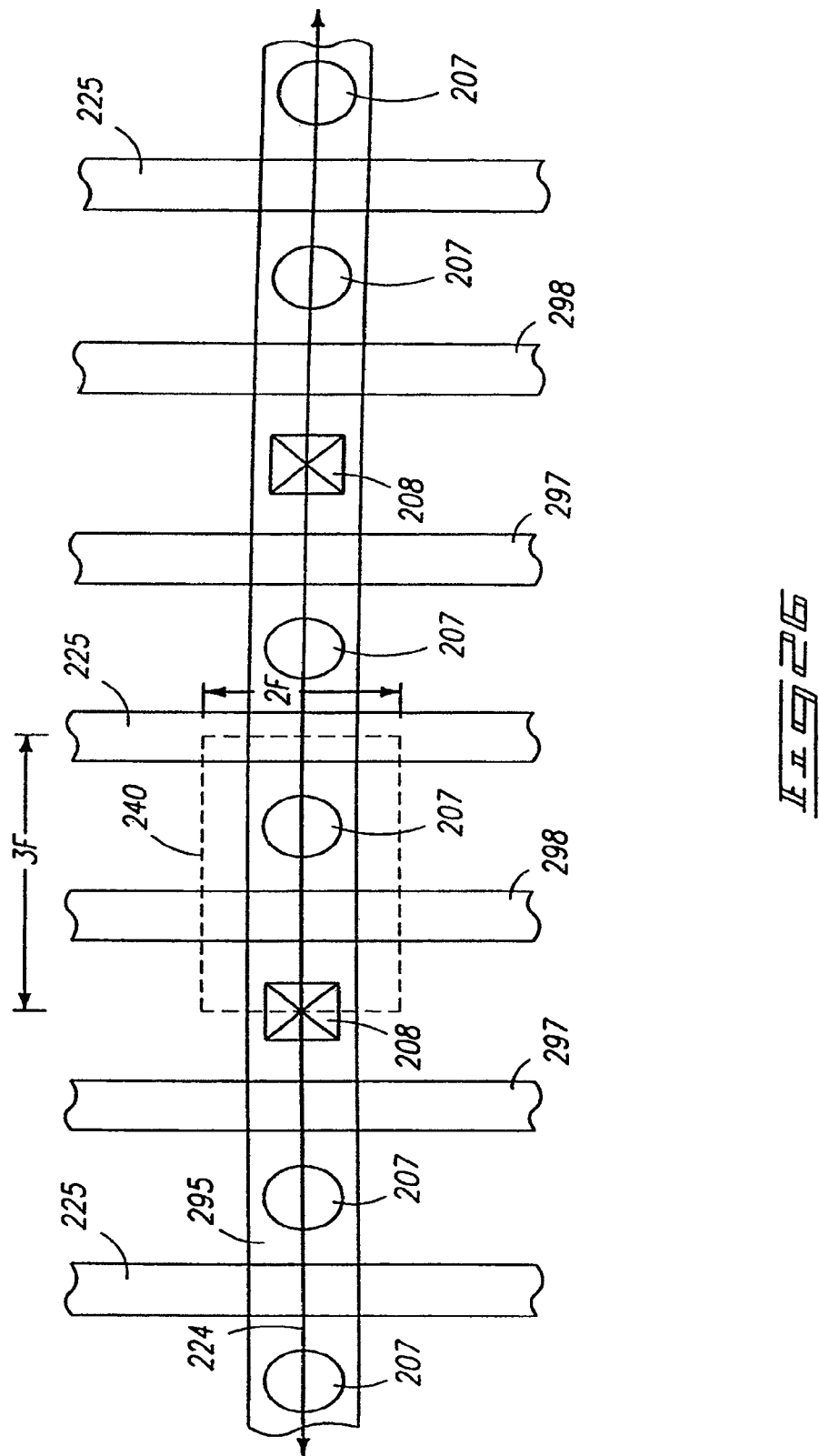
FIG. 26 is a diagrammatic top view of an alternate embodiment layout.

Specifically, FIG. 26 illustrates a continuous active area 295 formed within the bulk substrate relative to the associated overlying bit line 224. A series of capacitor contacts 207 and a series of bit line contacts 208 are formed relative to continuous active area 295. Word line pairs 297 and 298 share an intervening bit contact of adjacent pairs of memory cells, which in turn share a diffusion region in the bulk substrate. Electrical isolation between the adjacent pairs of memory cells is provided by intervening isolating conductive lines 225 which are formed in conjunction with the formation of word line pairs 297 and 298. Conductive lines 225 in operation are connected with ground or a suitable negative voltage, such as $V_{ss}$ or $V_{BB}$, and effectively substitute for the electrical isolation formerly provided by field oxide.

The elimination of field oxide also enables elimination of conventional active area stagger within the array, thus eliminating area consumed by word lines 96 and 99 of the FIG. 25 embodiment. Thus, the 4F lateral expanse consumed by a memory cell of FIG. 25 is capable of being reduced to 3F in the FIG. 26 embodiment (see dashed outline 240 in FIG. 26). This results in the area consumed by a single cell of $6F^2$, as compared to the $8F^2$ of the FIG. 25 embodiment.

However, bit line circuitry requirements and associated bit line spacing also play a role in the ability to shrink individual memory cell area within an array to a $6F^2$ level. Specifically, an actual bit line or data line structure is comprised of a pair of digit lines, namely D and D* (also referred to as "digit bar"), which connect with a single sense amplifier. Prior to the 256K memory cell level integration, D and D* ran in two separate, but adjacent, arrays with sense amplifiers being interposed between the arrays. This arrangement later came to be referred to as "open architecture." However, once DRAMs reached 256K density, the open architecture proved to be inadequate because of a poorer signal-to-noise ratio.

As a result, "folded bit line architecture" and improved cell designs were developed to overcome an unacceptable noise level. With a folded architecture, D and D* run side by side in common horizontal planes, but swap horizontal positions at various locations within a single array, thus producing a noise-canceling effect.

However, with a smaller memory cell size of $6F^2$ or lower being available, the space consumed by D and D* and their associated circuitry becomes a limiting barrier to the $6F^2$ size. In accordance with another preferred aspect of this disclosure, D and D* are fabricated to lie adjacent one another in common vertical planes to facilitate folded architecture and density maximization.

Figure 27:
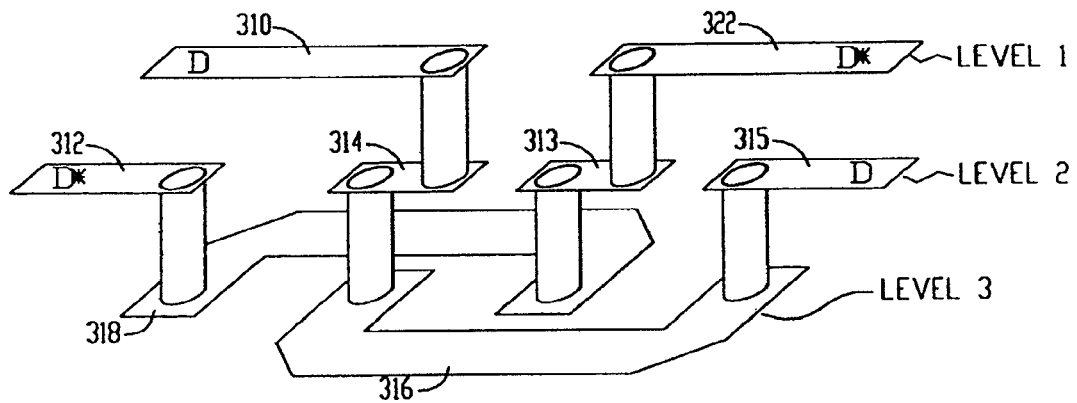
FIG. 27 is a perspective diagram illustrating digit line twist or swapping in a vertical plane.

For example, FIG. 27 illustrates one embodiment of a vertical three-level twist or swap design of D and D* to facilitate achieving preferred equal bit line lengths running on the upper and lower levels of the design. As illustrated on the left side of FIG. 27, a digit line D 310 is on Level 1, while a complementary D line D* 312 is on a Level 2 and directly beneath D line 310. D line 310 drops down to Level 2 at 314, then to a Level 3 where it is routed around the D* line by a conductive area 316, and is then elevated back up to Level 2 at 315. Accordingly, D line 310 has achieved a twist or a swap in the vertical direction, or Z-axis, from Level 1 to Level 2. A similar vertical twisting or swapping occurs for complementary digit line D* 312. It drops down from Level 2 to Level 3, is routed around D line 310 and conductive area 316 by a conductive area 318, and is then elevated to Level 2 at 313 and ultimately to Level 1 at 322. Accordingly, the twisting or swapping is relatively to the "z" direction, with attendant "x" and "y" areas being consumed on Level 3 for conductive areas 316 and 318.

Figure 28:
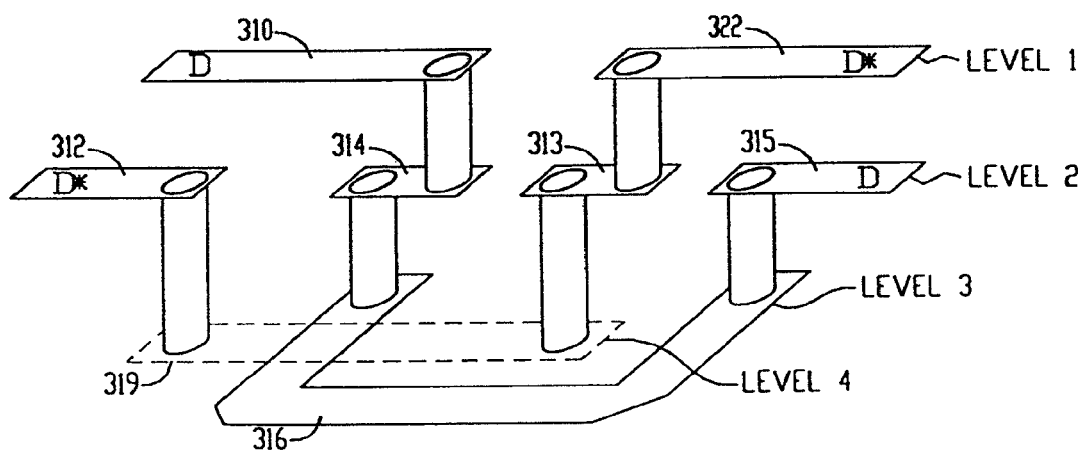
FIG. 28 is a perspective diagram illustrating alternate digit line twist or swapping in a vertical plane.

FIG. 28 shows an alternate four-level twist or swapping configuration. A conductive path 319 is provided at a sublevel 4. Sublevel 4 might comprise a substrate implant, polysilicon, metal, etc. Formation of a transistor from conductive area 316 and conductive path 319 is, however, highly undesirable.

Figure 29:
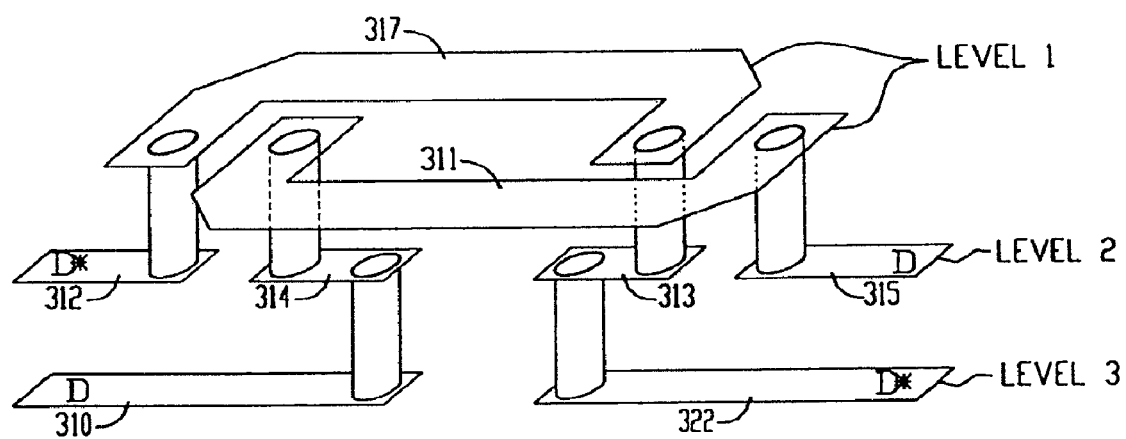
FIG. 29 is a perspective diagram illustrating further alternate digit line twist or swapping in a vertical plane.

FIG. 29 shows an alternate three-level configuration. As shown, the twisting or swapping of D line 310 and complementary digit line D* 312 occurs relative to Level 2 and Level 3 within Level 1.

Figure 30E:
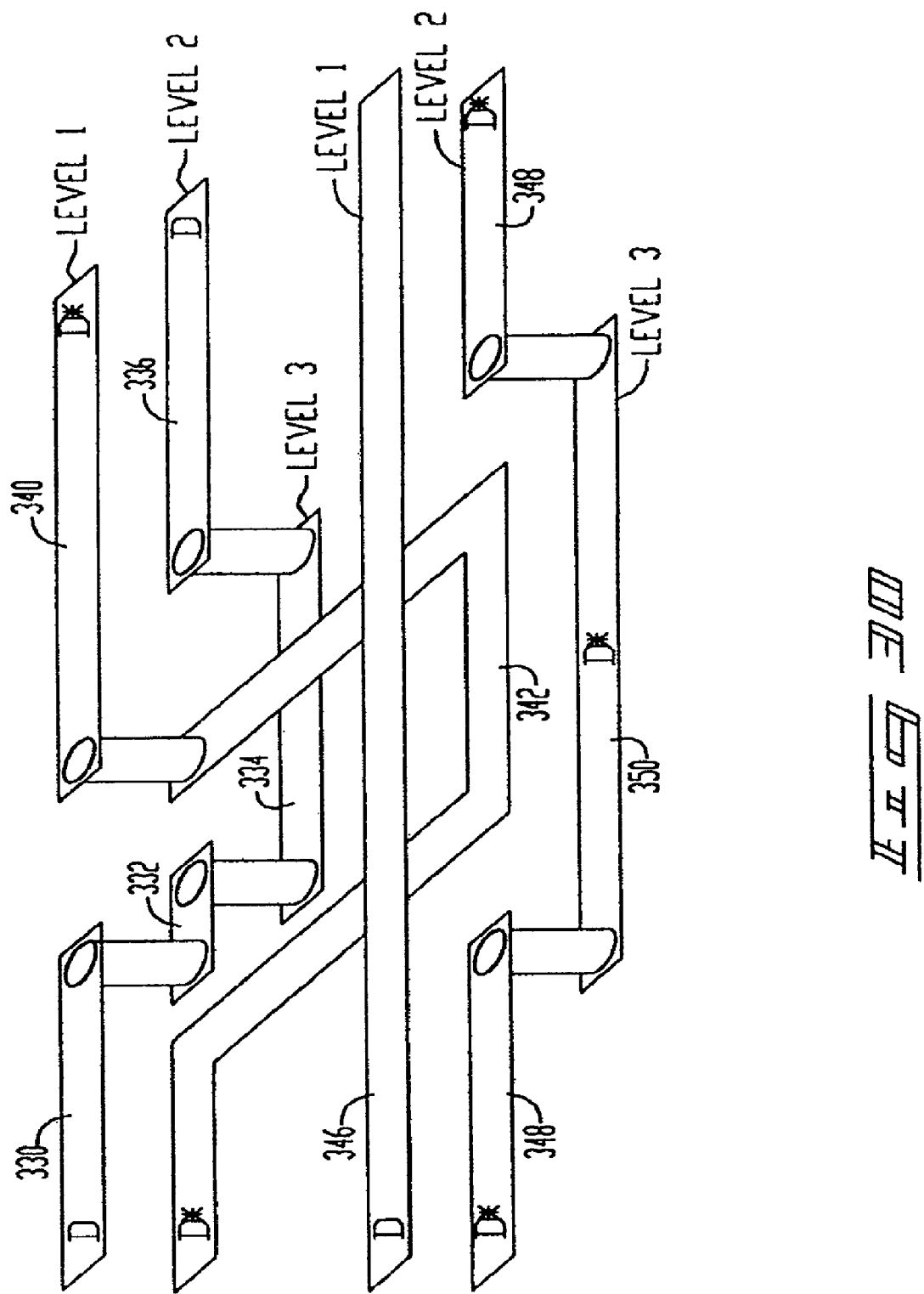
FIG. 30 is a perspective diagram illustrating still further alternate digit line twist or swapping in a vertical plane.

FIG. 30 shows another alternate configuration. Digit line D 330 is moved down one level to 336 via conductive areas 332 and 334, while D* is twisted upward to 340 via region 342. Region 342 extends outward in the x-y plane, while digit line D 330/region 336 stay in the same x-y configuration. Region 342 also extends into or within the vertical plane of an adjacent pair of digit lines D 346 and D* 348. To accommodate this extension of region 342, the bottom digit line D* 348 is moved to Level 3 along a region 350 and then brought back up to Level 2.

FIG. 31 is a rough diagrammatic view of a preferred memory array. The horizontal running lines principally comprise pairs of D and D* digit lines, with each pair extending relative to a shared sense amplifier 370. A series of word lines 373 extend from respective row decoders 372. Intervening electrically conductive isolation lines 374 are provided as shown and connect relative to a common grounding node line 376 between the upper and lower illustrated sections of a memory array.

For ease of illustration in FIG. 31, the digit line pairs feeding the respective shared sense amplifier 370 appear as if they were horizontally spaced side-by-side relative to one another. In actuality, the subject digit line pairs are vertically oriented relative to one another in accordance with the above-described preferred embodiments. For example, with respect to the top pair illustrated in FIG. 31, a digit line D 360 and a digit line D* 364 are illustrated. Twisting or swapping relative to a vertical plane is indicated by the "x" crossing at location 368. Other staggered swapping of the other pairs is also shown. Most desirably, each line of each pair spends 50% of its length on each of the top and bottom portion of the vertically aligned orientation.

Referring to FIG. 32, a layout for a portion of a DRAM array having the preferred double-layer twisted digit lines is depicted. Six digit line pairs (DP0, DP1, DP2, DP3, DP4 and DP5) are shown in this abbreviated layout. Each pair consists of a D line and D* line aligned in a common vertical plane. The uppermost digit lines and lowermost digit lines are depicted as being of different widths for clarity in the drawings. In reality, they would be of the same width. The illustrated dashed rectangles comprise active areas, with numeral 381 denoting bit contacts thereto. Lines 382 comprise word lines, while lines 383 are isolation lines substituting for field oxide as described above. Vertical contact vias (CV) are represented by the squares marked with an "X."

In the depicted portion of the array, digit line pairs DP0, DP2 and DP4 undergo the preferred twist or swap within region 371 by S1, CV3 and CV4, and by S2, CV1 and CV2. Digit line pairs DP1, DP3 and DP5 are untwisted in this portion of the array. The alternating twist pattern not only provides for efficient reduction of capacitive coupling between adjacent digit line pairs but also provides room for the twisting operation.

It will be noted that portions of first conductive strip S1 and second conductive strip S2 are vertically aligned with portions of adjacent digit line pairs. This is possible because first and second conductive strips S1 and S2 are not on level with either of the adjacent double-layer digit lines. The interconnect pattern could be any of the patterns as depicted by FIGS. 27-31, or different patterns.

With the vertical twist or swap embodiment, the signal-to-noise ratios are kept acceptably low. Most preferably, the vertical arrangement and the crossing digit lines are provided to allow for equal top and bottom orientation and access to the appropriate memory cells. Additionally, the adjoining digit pair of lines is also switched appropriately to diminish signal-to-noise problems. Further, the vertical plane swapping facilitates $6F^2$ or smaller memory cell size.

Preferably, the twisting locations in the array are at quarter marks, either the first and third quarter, or at the halfway mark in the array. This allows for different digit line pair arrangements to be located next to each other. Further, the memory cells may be located between, along side, on top, or underneath the bit lines, thus accommodating for trench, stacked, or elevated designs.

FIG. 33 is a cross-sectional view of a wafer fragment 390 as would be positionally taken through and along the bit line of FIG. 26. It is similar to FIG. 24 but for two notable exceptions. Like numerals from FIG. 24 are utilized where appropriate with differences of any significance being indicated with different numerals. The first notable exception is absence of field oxide regions within the array, with conductive isolation lines 383 substituting therefor. Word lines of the array are designated with numerals 382.

The second notable exception concerns provision of the digit line as two composite lines, namely D line 394 and D* line 395 separated by an insulating dielectric layer 393. Each composite digit line is preferably of the same construction as composite digit line 124 of FIG. 24. An insulating dielectric layer 397 overlies composite D* line 395 intermediate conductive runners 136. Thus, in this described embodiment, the circuitry constitutes a die which is fabricated to include five composite conductive line layers. The first of those layers constitutes composite lines 382 and 383, which are collectively formed in the same essential processing steps. The second composite conductive line layer constitutes cell polysilicon layer 114, which is patterned to form lines in the area peripheral to the array.

The third and fourth composite conductive line layers constitute D and D* lines 394 and 395, respectively. The fifth conductive line layer constitutes the conductive runners 136.

Figure 34:
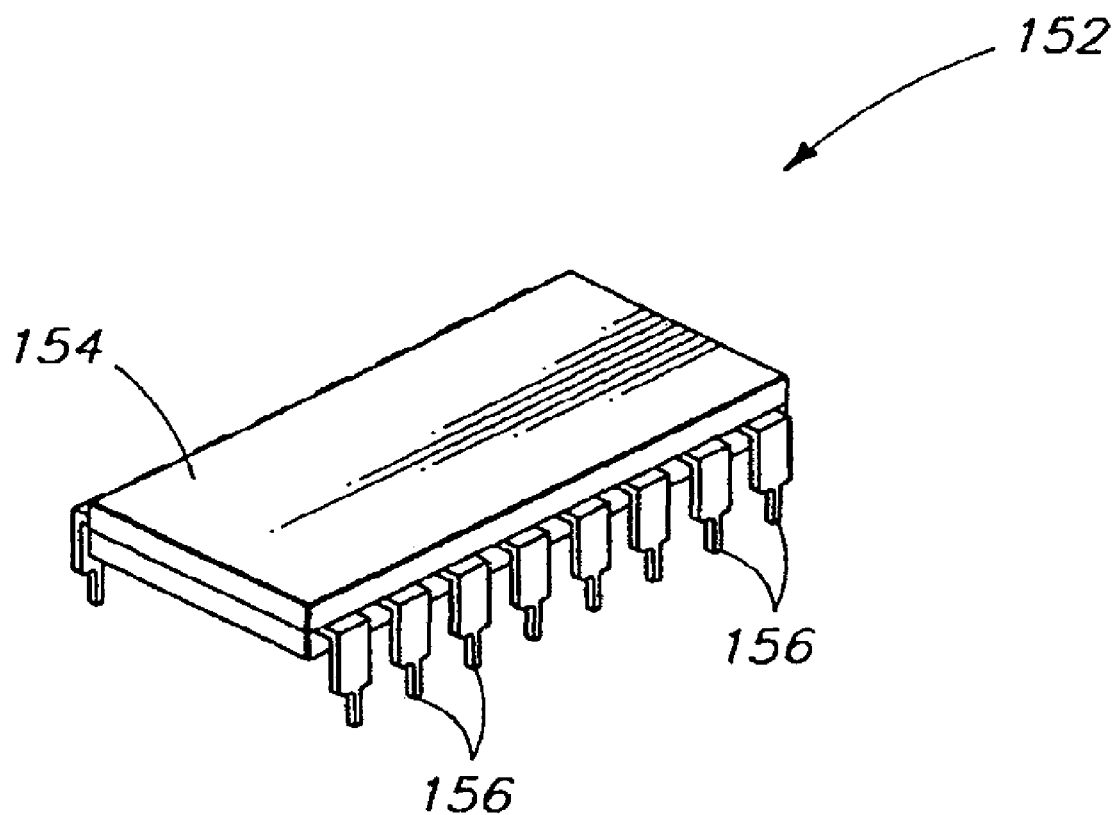
FIG. 34 is a perspective view of a semiconductor package.

The above-described constructions are advantageously utilized to produce semiconductor memory devices, such as those depicted in FIGS. 34 and 35. Specifically, a semiconductor die 150 (FIG. 35) is encapsulated in a package 152 (FIG. 34). Such is shown in the form of a dual in-line package (DIP) constituting a ceramic encapsulating body 154 having a series of electrically conductive interconnect pins 156 extending outwardly therefrom (FIG. 34).

Semiconductor die 150 (FIG. 35) is comprised of a series of 64 multiple memory arrays 160 arranged as shown. The area immediately surrounding the respective memory arrays 160, such as the illustrated areas 162, contain what is referred to as pitch circuitry, as such circuitry is "on pitch" with the conductive lines which extend outwardly from the associated memory arrays 160. Such pitch circuitry 162 would comprise, for example, sense amplifier circuitry, equilibration circuitry, bias devices, I/O decoders, and other circuitry.

Die areas or regions 164, 166, 168, 170, 172 and 174 constitute what is referred to as peripheral circuitry. Pitch circuitry areas 162 electrically connect with the peripheral circuitry areas, with the peripheral circuitry electrically interconnecting with the illustrated series of bond and probe pads 175. Suitable wires or other means would be utilized to connect with bond pads 175 to provide electrical connection to pins 156 of FIG. 34. The peripheral circuitry would preferably include the operably interconnected control and timing circuitry, address and redundancy circuitry, data and test path circuitry, and voltage supply circuitry, which collectively enable full access to all addressable memory cells of the memory arrays. For example, peripheral circuitry region 164 would typically comprise global column decode and column addressing circuitry. Region 174 could include section logic, DC sense amps and write drivers. Peripheral circuitry regions 170 and 172 would include power amplifiers, power busing and chip capacitors. Regions 166 and 168 would include other logic circuitry.

One or more of the above-described processes and die configuration can facilitate formation of 64M, 16M, and 4M memory dice or devices having smaller sizes or consumed monolithic die areas than has heretofore been practically achieved. For example, at a 64M memory cell integration level, a total of no more than 68,000,000 (typically, exactly 67,108,864) functional and operably addressable memory cells are arranged within collective multiple memory arrays 160. The occupied area of all of the functional and operably addressable memory cells on the die consumed within the multiple memory arrays will have a total combined area which is no greater than 53 mm$^2$.

In accordance with standard semiconductor memory fabrication, the respective memory arrays are provided with redundant memory cells which, after test, can be operably fused to replace inoperable memory cells created during fabrication. Where an inoperable memory cell is determined during tests, the entire respective row (word line) or column (bit line) is fused out of operation, and an operable redundant row or column is substituted in its place. Accordingly, during fabrication, the individual respective memory arrays, such as those shown in the above FIG. 35 example and for 16M integration, are intended to be fabricated to include more than $\frac{1}{64}$th of the total operable memory cells of the finished memory device to contend with inoperable circuitry undesirably fabricated within the arrays.

However, upon final fabrication and assembly, the respective memory arrays are provided to contain $\frac{1}{64}$th of the total memory cells of the memory device/chip. Accordingly, each memory array 160 would have an area which is greater than the sum of $\frac{1}{64}$th of the area which would be taken up by the total functional and operably addressable memory cells within the respective subarray. Regardless, that surface area of the die which is consumed by the memory cells which are finally functional and operably addressable through final fusing or other means will have a total combined area (although perhaps disjointed if internal inoperable cells are fused out) in this inventive example which is no greater than 53 mm$^2$. However, the area consumed by a respective individual memory array 160 will be greater than $\frac{1}{64}$th of the described 53 mm$^2$ due to the redundant circuitry. Sixty-four (64) subarrays are the preferred number for 16M integration, while 256 subarrays would be more preferred and typical for 64M integration.

There will be areas on semiconductor die 150 within at least one memory array 160 where at least 100-square microns of continuous die surface area has a collection of all operable memory cells, with no inoperable memory cells being included within that particular 100-square micron area. In accordance with one aspect of the invention, there will be at least 128 memory cells within such 100-square microns of continuous die surface area.

The above-described preferred maximum 53 mm$^2$ area occupied by finally functional and addressable memory cells on a die for 64M integration is with respect to the above-described four or less composite conductive line layer construction of FIG. 24. With such four conductive line layers, the peripheral circuitry, the pitch circuitry and the memory arrays will have a total combined continuous surface area on the die which is less than or equal to 106 mm$^2$.

Where five composite conductive line layers are utilized, the die area consumed by all of the functional and operably addressable memory cells will have a reduced total combined area (although again, most likely noncontinuous/disjointed) which is no greater than 40 mm$^2$ for 64M integration. Further, in such instance, the peripheral circuitry, the pitch circuitry and the memory arrays will have a total combined continuous surface area on the die which is less than or equal to 93 mm$^2$.

Further, for the exemplary five composite conductive line layer construction, there will be areas on semiconductor die 150 within at least one memory array 160 where at least 100-square microns of continuous die surface area have a collection of all operable memory cells, with no inoperable memory cells being included within that particular 100-square micron area. In accordance with an aspect of the invention, there will be at least 170 memory cells within such 100-square microns of continuous die surface area.

In accordance with another aspect of the invention and at the 16M memory cell integration level, a total of no more than 17,000,000 (typically, exactly 16,777,216) functional and operably addressable memory cells are provided by the multiple memory arrays 160. The occupied area of all of the functional and operably addressable memory cells on the die consumed within the multiple memory arrays will have a total combined area which is no greater than 14 mm$^2$. Such is achievable, by way of example only and not by way of limitation, in the context of a four or less composite conductive line layer construction as described above with respect to FIGS. 24 and 25. In such instance, the periphery circuitry, the pitch circuitry and the memory arrays have a total combined continuous surface area on the die which is less than or equal to 35 mm$^2$. Also, at least one of the memory arrays which contains at least 100-square microns of continuous die surface area will have at least 128 functional and operably addressable memory cells.

Where five composite conductive line layers are utilized, the die area consumed by all of the functional and operably addressable memory cells will have a reduced total combined area (although again, most likely noncontinuous/disjointed) which is no greater than 11 mm$^2$ for 16M integration. Further, in such instance, the peripheral circuitry, the pitch circuitry and the memory arrays will have a total combined continuous surface area on the die which is less than or equal to 32 mm$^2$. Further, at least one of the memory arrays which contain at least 100-square microns of continuous die surface area will have at least 170 functional and operably addressable memory cells.

For example, with respect to the above-described FIG. 35 depiction and a five composite conductive line layer construction, at the 16M integration level, each of the 64 memory arrays 160 would include 256K (truly 262,144) functional and operably addressable memory cells. An example of the ultimate dimension for semiconductor die 150 is 3.78 mm by 8.20 mm, resulting in a total continuous die area of 31.0 mm$^2$.

In accordance with another aspect of the invention and at the 4M memory cell integration level, a total of no more than 4,500,000 (typically, exactly 4,194,394) functional and operably addressable memory cells are provided by the multiple memory arrays 160. The occupied area of all of the functional and operably addressable memory cells on the die consumed within the multiple memory arrays will have a total combined area which is no greater than 3.3 mm$^2$. Such is achievable, by way of example only and not by way of limitation, in the context of a four or less composite conductive line layer construction as described above with respect to FIGS. 24 and 25. In such instance, the periphery circuitry, the pitch circuitry and the memory arrays have a total combined continuous surface area on the die which is less than or equal to 11 mm$^2$. Also, at least one of the memory arrays which contain at least 100-square microns of continuous die surface area will have at least 128 functional and operably addressable memory cells.

Where five composite conductive line layers are utilized, the die area consumed by all of the functional and operably addressable memory cells will have a reduced total combined area (although again, most likely noncontinuous/disjointed) which is no greater than 2.5 mm$^2$ for 4M integration. Further, in such instance, the peripheral circuitry, the pitch circuitry and the memory arrays will have a total combined continuous surface area on the die which is less than or equal to 10.2 mm$^2$. Further, at least one of the memory arrays which contain at least 100-square microns of continuous die surface area will have at least 170 functional and operably addressable memory cells.

The above-described products provide, for example, memory circuit integration at the 64M, 16M, and 4M integration levels utilizing less die surface area than has previously been achieved at such integration levels. Such can facilitate making the ultimate size of the resultant package smaller by making the integrated dice potentially smaller. Further, for the manufacturer, more dice per wafer are capable of being achieved, thus increasing yield, thereby lowering manufacturing costs and increasing profitability. Further, the higher memory cell density enables lower operating power and greater speed with less parasitic capacitance. Further, the word lines and digit lines can be shorter, and lower overall voltages can be utilized.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. An integrated circuit comprising:
   a semiconductor die;
   at least 67,108,864 and no more than 68,000,000 functional and operably addressable memory cells arranged on the semiconductor die, the memory cells occupying a combined area on the semiconductor die that is no greater than 53 mm$^2$, wherein each memory cell comprises at least one container-configured capacitor coupling to a word line formed substantially below the at least one container-configured capacitor, each of the plurality of memory cells coupling to a digit line formed substantially above the at least one container-configured capacitor;
   column addressing circuitry formed on the semiconductor die and coupled to the memory cells for addressing columns of the memory cells; and
   sense amplifier circuitry formed on the semiconductor die and coupled to the memory cells for sensing signals from rows of the memory cells,
   wherein the memory cells are formed with a minimum capable photolithographic feature dimension, a single one of the memory cells consuming an area of no more than six times the square of the minimum capable photolithographic feature dimension.

2. An integrated circuit comprising:
   a semiconductor die;
   at least 16,777,216 functional and operably addressable memory cells arranged on the semiconductor die, the memory cells die occupying a combined area on the semiconductor die that is no greater than 14 mm$^2$, wherein each memory cell comprises at least one container-configured capacitor coupling to a word line formed substantially below the at least one container-configured capacitor, each of the plurality of memory cells coupling to a digit line formed substantially above the at least one container-configured capacitor;
   column addressing circuitry formed on the semiconductor die and coupled to the memory cells for addressing columns of the memory cells; and
   sense amplifier circuitry formed on the semiconductor die and coupled to the memory cells for sensing signals from rows of the memory cells,
   wherein the memory cells are formed with a minimum capable photolithographic feature dimension, a single one of the memory cells consuming an area of no more than six times the square of the minimum capable photolithographic feature dimension.

* * * * *

UNITED STATES PATENT AND TRADEMARK OFFICE
CERTIFICATE OF CORRECTION

PATENT NO. : 8,299,514 B2  Page 1 of 1
APPLICATION NO. : 13/285182
DATED : October 30, 2012
INVENTOR(S) : Keeth et al.

It is certified that error appears in the above-identified patent and that said Letters Patent is hereby corrected as shown below:

In the Claims

Claim 2, Column 18, line 32, delete the word "die".

Signed and Sealed this
Thirteenth Day of May, 2014

Michelle K. Lee
*Deputy Director of the United States Patent and Trademark Office*